United States Patent [19]
Taoka et al.

[11] Patent Number: 6,088,520
[45] Date of Patent: Jul. 11, 2000

[54] METHOD OF PRODUCING HIGHLY PRECISE CHARGED BEAM DRAWING DATA DIVIDED INTO PLURALITY OF DRAWING FIELDS

[75] Inventors: Hironobu Taoka; Kinya Kamiyama; Koichi Moriizumi, all of Hyogo, Japan

[73] Assignee: Mitsubishi Denki Kabushiki Kaisha, Tokyo, Japan

[21] Appl. No.: 08/971,132

[22] Filed: Nov. 13, 1997

[30] Foreign Application Priority Data

Dec. 6, 1996 [JP] Japan .................................. 8-327083
May 26, 1997 [JP] Japan .................................. 9-134947

[51] Int. Cl.[7] ...................................................... G06F 17/50
[52] U.S. Cl. ........................................................ 395/500.22
[58] Field of Search ...................................... 364/488, 489, 364/490, 491; 395/500.02–500.22; 430/30, 296

[56] References Cited

U.S. PATENT DOCUMENTS

| | | | |
|---|---|---|---|
| 5,366,847 | 11/1994 | Powers ..................................... | 430/296 |
| 5,432,714 | 7/1995 | Chung et al. ........................ | 395/500.22 |
| 5,699,266 | 12/1997 | Chung et al. ........................ | 395/500.22 |
| 5,740,068 | 4/1998 | Liebmann et al. .................. | 395/500.22 |
| 5,792,581 | 8/1998 | Ohnuma .................................... | 430/30 |
| 5,812,412 | 9/1998 | Moriizumi et al. ................ | 395/500.22 |

OTHER PUBLICATIONS

Cheng, C–I. and Ho, C–y "SEFOP: A Novel Approach to Data Path Module Placement," IEEE/ACM International Conference on Computer–Aided Design, Nov. 1993.

*Primary Examiner*—Kevin J. Teska
*Assistant Examiner*—Leigh Marie Garbowski
*Attorney, Agent, or Firm*—McDermott, Will & Emery

[57] ABSTRACT

A method of producing charged beam drawing data includes a basic figure processing step of performing a basic figure processing to design layout data to output basic figure data, a first segmenting step of converting the basic figure data as if segmenting a basic figure over a boundary of a figure processing region in the basic figure data by the boundary, a first searching step of searching a minute figure to draw which satisfies a prescribed size condition among the figures produced by segmenting in said first segmenting step, a restoring step of integrating the minute figure to draw searched by said first searching step and a figure adjacent to the minute figure, and performing a further basic figure processing to restore the figures in said basic figure data, an allocating step of allocating the figures restored by said restoring step to drawing fields, and a step of converting the figures allocated by the allocating step to charged beam drawing data.

22 Claims, 42 Drawing Sheets

Wd±0.025 μm

Wd±0.025 μm

METHOD OF PRODUCING HIGHLY PRECISE CHARGED BEAM DRAWING DATA DIVIDED INTO PLURALITY OF DRAWING FIELDS

RELATED APPLICATIONS

This application is a cross-reference to the following three U.S. patent applications, U.S. patent application Ser. No. 08/856,706 filed May 15, 1997, which is a cross-reference to application Ser. No. 08/535,729 filed Sep. 28, 1995, which is a cross-reference to application Ser. No. 08/555,074 filed Nov. 8, 1995.

BACKGROUND OF THE INVENTION

1. Field of the Invention

The present invention relates generally to a method of producing charged beam drawing data used to produce drawing data necessary for drawing by a charged beam drawing apparatus from design layout data for a semiconductor device, and more particularly, to a computer program-implemented method of producing drawing data which permits figures to be accurately drawn in a vector scan type charged beam drawing apparatus.

2. Description of the Background Art

Electron beam drawing (charged beam drawing) is widely used for producing masks for use in the manufacture of semiconductor devices, particularly Large Scale Integrated circuits for its high performance in processing minute figures and its high controllability.

Electron beam drawing methods can be divided into two kinds, raster scan type and vector scan type methods. The raster scan type method has been widely used for producing masks for its simple device structures and readiness to produce drawing data using the method.

By the raster scan type method, however, the drawing speed greatly depends on the minimum grid size (address unit size) for designating the size of a figure to draw and a drawing position. As the minimum grid size decreases, the time required for drawing the entire figure increases. In fact, the raster scan type method takes too long a drawing time period and is not applicable to drawing of a mask for a 256 M bit Dynamic Random Access Memory (DRAM) which requires a very small address unit. The raster scan type method is not suitable for the case of fabricating a large number of elements on a single chip as is recently often practiced.

In recent years, the variable shaping type method, one kind of the vector scan type methods has attracted much attention. By the variable shaping type drawing method, an electron beam is shaped depending upon the size of a figure to draw, and only the necessary region is irradiated with the electron beam. The drawing speed is higher and the address unit size may be small as a result. The variable shaping type method therefore would be the main stream of electron beam direct drawing employed for producing masks for devices emerging after the 256 Mbit DRAM and developing devices emerging after the 1 gigabit DRAM.

Despite the above-described characteristic, by the variable shaping type drawing method, the processing is more complex and takes longer than the raster scan type method in producing drawing data.

Now, the procedure of producing drawing data used by the variable shaping type drawing method and the procedure of drawing will be described.

FIG. 1 shows a kind of LSI design pattern data. As shown in FIG. 1, the LSI design pattern data is usually represented by a figure 480 of a polygon (a series of vertexes). The upper side width of the figure is Wd. The design layout data should be divided into basic figures such as rectangle, regular square, triangle and trapezoid (hereinafter generically referred to as "basic figure", as they are basic figures which can be shaped at a time by the variable shaping type electron beam drawing apparatus), in order to draw a figure based on the data using the variable shaping type electron beam drawing apparatus. The division is called basic figure division or trapezoidal division. The processing is also called basic figure processing.

There are various kinds of basic figure division including a method of horizontally inserting dividing lines from the vertexes of the polygon as shown in FIG. 2. In the example shown in FIG. 2, figure 480 is divided into two rectangles 482 and 484 by a dividing line in the horizontal direction. Rectangle 482 has positional coordinates (x1, y1), a height HS1 and a width WS1. Rectangle 484 has positional coordinates (x2, y2), a height HS2 and a width WS2. Herein, the sum of HS1 and HS2 is equal to HS. WS1 is equal to WS.

Rectangle 480 as shown in FIG. 1 can be also divided into basic figures by inserting a dividing line in the vertical direction from a vertex of the polygon as shown in FIG. 3. In the example shown in FIG. 3, rectangle 480 is divided into two elongate rectangles 486 and 488 by the dividing line in the vertical direction. Rectangle 486 has positional coordinates (x2, y2), a height HS and a width WS2. Rectangle 488 has positional coordinates (x3, y3), a height HS1 and a width WS3. Note that the sum of WS2 and WS3 is equal to Wd.

Now, the procedure of actually drawing a figure using the drawing data thus divided into basic figures will be described. When the pattern data of rectangle 482 shown in FIG. 2 is input to the electron beam drawing apparatus, an electron beam shaping deflector forms an electron beam having width WS1 and height HS1. The beam is shifted to an irradiation position (x1, y1) by a deflector for designating a position for irradiating an electron beam, and irradiates resist applied on a workpiece such as mask substrate and silicon wafer for a time period corresponding to an exposure amount necessary for the photosensitive reaction of the resist. Then, the pattern data corresponding to figure 484 in FIG. 2 is input to the electron beam drawing apparatus, and the figure is similarly drawn by an electron beam. This procedure is sequentially repeated for all the parts of the LSI pattern to draw the entire LSI pattern.

The above process of producing drawing data used by the variable shaping type drawing method is encountered with the following problem. The design layout data shown in FIG. 1 is converted into drawing data, which is used to draw a figure on a mask, followed by developing resist to form a resist pattern on the mask, which is shown as resist pattern 490 in FIG. 4 by way of illustration. In connection with the pattern size precision of a portion having a width Wm in resist pattern 490, the cause of the precision degradation will be considered. Note however that any factors related to the pattern forming process conditions such as resist development are not considered here.

Let us assume that the design layout data shown in FIG. 1 is divided by a horizontal dividing line as shown in FIG. 2. Width Wm is affected only by the precision of shaping the electron beam formed according to rectangle 482 shown in FIG. 2, in other words only the size precision of the electron beam for the portion corresponding to width WS1.

Meanwhile, there is another case when the figure is divided by a vertical dividing line as shown in FIG. 3. Width Wm is affected by the precision of the irradiation position of the electron beam corresponding to rectangle 486 shown in FIG. 3, the precision of the irradiation position of the electron beam corresponding to rectangle 488, and the shaping precision. Two more factors affect on the resist pattern size precision than the case of dividing the figure by the horizontal dividing line shown in FIG. 2.

A plurality of resist patterns are actually formed using drawing data divided by the different dividing methods as shown in FIGS. 2 and 3, and the measured sizes are given in FIGS. 5 and 6. FIG. 5 corresponds to the use of the drawing data shown in FIG. 2 and exhibits a dispersion in resist pattern size, when the resist pattern of the portion having width Wm is formed using a one-shot electron beam irradiation. FIG. 6 corresponds to the use of the drawing data shown in FIG. 3 and exhibits a dispersion in sizes when the resist pattern of the portion having width Wm is formed by irradiating two shots of electron directed upon different positions.

As can be seen from FIGS. 5 and 6, when the resist pattern is formed by irradiation of the one-shot electron beam, the dispersion in size is only about ±0.025 $\mu$m, while when the pattern is formed by two shots of electron beams, the dispersion is as great as ±0.075 $\mu$m. More specifically, the use of two shot electron beam irradiation degrades the size precision, which is one disadvantage associated with producing drawing data by the variable shaping type method.

Another disadvantage encountered in the process of producing drawing data by the variable shaping type method is that when a resist pattern is formed by two or more shots of electron beams irradiated upon different positions, and among the plurality of shots a shot forming an edge of the resist pattern is in a very small size, the size precision of resist to form is further degraded, which will be further described in conjunction with FIGS. 7 to 10.

Now, let us assume that a one shot electron beam is shaped based on rectangle 492 shown in FIG. 7. The graph shown in FIG. 8 corresponds to the intensity distribution of the electron beam at the time. Referring to FIG. 8, the intensity distribution does not form a complete rectangle with edges spreading out. The slopes of the intensity distribution at the edges change depending on the size of a beam to shape. The case having a large slope is referred to as "the beam sharpness is low", and the case having a small slope is referred to as "the beam sharpness is high". Generally speaking, as the size of the beam increases, the Coulomb repulsion in the electron beam increases, which lowers the beam sharpness, and the intensity distribution is rounded off at the edges.

Now, let us assume that a pattern having the same size as rectangle 492 shown in FIG. 7 will be irradiated with two shots of electron beams. Referring to FIG. 9, the pattern is formed of a relatively large rectangle 494 on the right and a small size rectangle 496 on the left. The intensity distribution of the electron beam used at the time is shown in FIG. 10. As shown in FIG. 10, when the pattern is formed by two shots, the intensity distribution of the beam is different at the edge (on the left) from the case of drawing with one shot, and a resist pattern with a different size results.

As shown in FIG. 9, a plurality of resist patterns including minute figures to draw are produced with two shots, and the measured sizes of the resulting resist parts are given in FIG. 11. The dispersion in size is larger than the result of one shot drawing (FIG. 5), and there is also a difference in the average value. The difference in the average value is derived from the electron beam irradiation of the above-described minute figures to draw.

The size of a minute figure to draw suffering great degradation in size precision largely depends on the electron beam drawing apparatus to use, the kind of resist, and the method and conditions of pattern forming processing. In general, the degradation in the size precision is most apparent when the length of widthwise or heightwise side of the figure is not more than 0.5 $\mu$m.

A drawing data processing flow for the above processing by a conventional variable shaping type electron beam drawing apparatus will be described in conjunction with FIG. 12. Design layout data (hereinafter simply as "design data") 100 is divided into a plurality of equal size figure processing region units by a figure processing region dividing portion 102. This is for the purpose of providing for high speed operation by dividing an LSI chip region including an enormous amount of figure data into figure processing regions and reducing the number of pieces of figure data to process at a time, as well as for the purpose of processing the data within the limit of processing capacity by the system configuration of the drawing data producing apparatus (particularly the memory capacity). In addition, a plurality of CPUs may be employed to process figures in the figure processing regions in parallel for high speed processing as will be described later. The size of a figure processing region itself may be set as desired.

During the figure processing region division processing, a redundancy region is provided in the periphery of each figure processing region, and a figure within the redundancy region in the periphery of each figure processing region is attached to the figure processing region. In each figure, the portion in the vicinity of the figure processing region is included both in one of two figure processing regions across the boundary and in the redundancy region of the other figure processing region. Thus, the figure spanning the boundary between the two figure processing regions will not be disconnected on the figure processing boundary. The figure is disconnected at the boundary of the redundancy region. In other words, the figure processing is conducted to the region including both the figure processing region and redundancy region. This is for the purpose of preventing inappropriate reduction of the figure in the vicinity of the figure processing boundary by the sizing of the figure or the like.

The figure within the redundancy region is allocated to each figure processing region boundary and divided in the course if necessary in a redundancy region removing portion which will be described, in order to prevent the generation of minute figures to draw at the figure processing region boundary. The space between the redundancy portion boundary and the figure processing region boundary needs only be at a value adequately larger than the size of an intended minute figure to draw. Figure processing region dividing portion 102 thus outputs sets of figure data 104.

Basic figure processing portion 106 then divides the figure in figure data 104 into basic figures. Among the various methods of dividing a figure into basic figures as described above, herein each figure is divided into basic figures by drawing a dividing line from a vertex of the figure in the horizontal direction. At the time, overlapped portions between figures are removed as part of the basic figure processing, in order to prevent the same region from being irradiated more than once with an electron beam. If the same region is repeatedly irradiated with an electron beam, only the portion will have higher irradiation energy which causes size errors, and therefore the processing of removing overlapped portions is essential to producing drawing data for the variable shaping type electron beam drawing apparatus.

Depending upon the structure of semiconductor, the region other than for those input during designing is sometimes irradiated with an electron beam. In order to form an opening portion in a mask, for example, the region other than for the opening portion must be sometimes irradiated with an electron beam depending upon the kind of resist. This sometimes necessitates a white-black reversing processing to generate a figure used for irradiating an electron beam to a region originally without any figure. At the time, the overlapped portions are removed from figures other than those in the redundancy region of the figure processing region.

Among various methods for dividing a figure into basic figures by means of removing overlapped portions or reversing between black and white portions, a generally used method is a slab method. Herein, the processing of removing overlapped portions by the slab method will be described in conjunction with FIGS. 13 and 14. In the following description, dividing lines are drawn in the horizontal direction, and slab proceeds in the horizontal direction, the dividing line may be in any predetermined direction including the vertical direction.

Referring to FIG. 13, there are three figures 520, 522 and 524 included in figure data 104. Dividing lines 530, 532, 534, 536, 538 and 540 extending horizontally from the vertexes of each figure are inserted in the entire processing region. Thus, the processing region is divided into elongate rectangular regions (slabs) 550, 552, 554, 556, 558, 560 and 562. The figures are divided by the slab boundaries.

The sides of figures 520, 522 and 524 are attached with arrows to be vectors. The directions of arrows are determined based on whether to trace the vertexes along the sides clockwise or anticlockwise. A value indicating the direction of each vector within a slab (hereinafter referred to as "vector directional value") is set for the vector. If for example slabs are horizontally formed as shown in FIG. 13, the vector from the lower side of a slab towards the upper side is set to 1, and the vector from the upper side to lower side is set to -1. This state is shown for slab 554 in FIG. 13. Note that in FIG. 13, vector directional vales when tracing the vertexes of the figures clockwise are shown.

Now, a method of removing overlapped figure portions will be described. All the vectors included in each slab are sorted out according to the coordinate value of the junction of each vector and the lower end of the slab. The vector directional value given to each vector is added up sequentially from the left, if the slabs are horizontally formed, and the vector whose addition to the total value of vector directional values results 0 is searched. The vector with which the addition is started and the vector nullifying the result of addition of vector direction values are used to form a basic figure. An example of the processing will be described in conjunction with FIG. 13.

Addition of vectors are started first from the vector on the left in each slab. In slab 554 shown in FIG. 13, the vector direction values of the first, second, third and fourth vectors are 1, 1, -1 and -1, respectively. If addition of vector direction values is started from the first vector, the result of addition of the vector direction values is 2 at the second vector, and 1 at the third vector, and 0 at the fourth vector. Therefore, the vector on the left end and the fourth vector in slab 554 form a figure, and the second and third vectors are removed as unnecessary vectors. The processing is conducted to all the vectors in the slabs to remove all the figure overlapped portions. FIG. 14 shows the result of processing. In the example shown in FIG. 14, figures 520, 522 and 524 in FIG. 13 are divided into figures 570, 572, 574, 576 and 578 including rectangles and trapezoids. By this method, data is divided into basic figures in the processing result, and the overlapped portions between the figures are also removed. For its high processing speed, this method is suitable for processing a large volume of figure data.

In place of the slab method, optimum basic figure dividing as disclosed by Japanese Patent Laying-Open No. 7-105765 assigned to the assignee of the present invention may be used. Japanese Patent Laying-Open No. 7-105765 is herein incorporated by reference through its entirety.

Basic figure processing portion 106 further performs sizing processing to figures. By the processing, some figures are expanded or reduced. If figures in the vicinity of a figure processing region are disconnected by the figure processing region, only the portion within the figure processing region is expanded/reduced and sizing fault may result. The redundancy region is provided to the figure processing region in figure processing region dividing portion 102 in order to expand/reduce the figure included in the redundancy region for correct sizing. The figure data divided into basic figures by basic figure processing portion 106 is output as basic figure data 500.

Redundancy region removing portion 502 allocates figures included in the redundancy regions of basic figure data 500 to figure processing regions and divides them if necessary in the course such that no minute figure to draw is generated on boundaries of the figure processing regions. Thus, in the entire LSI chip region, overlapped figure portions generated by the processing of the figure processing region dividing portion are removed.

Referring to FIG. 12, basic figure data allocated to the figure processing regions are merged at a figure data merge portion 504 and output as basic figure data 506. A drawing field allocating portion 508 allocates basic figure data 506 to a region which can be drawn using the electron beam drawing apparatus only by deflecting an electron beam (hereinafter referred to as "drawing field region"). Figure processing region dividing portion 102, redundancy region removing portion 502 and drawing field allocating portion 508 perform essentially the same kind of processing, which will be detailed in conjunction with FIG. 7 and on. As is redundancy region removing portion 502, drawing field allocating portion 508 divides a figure on a drawing field boundary such that no minute figure to draw is generated on the drawing field boundary. In the variable shaping type electron beam drawing apparatus as described by way of illustration, the size of the drawing field region may be set to a desired value not more than 2.5 mm.

Basic figure data 510 allocated to the drawing fields is formatted by an electron beam drawing data format portion 122 into electron beam drawing data 512 in a data structure which can be input to a desired drawing apparatus.

The present invention relates to, in the above processing flow, a drawing data producing apparatus capable of precisely reducing the generation of a minute figure to draw within a figure processing region and on the boundary of a figure processing region. Now, a disadvantage to be overcome by the present invention will be detailed.

Redundancy region removing portion 502 will be detailed in conjunction with the flow chart in FIG. 15 and an example shown in FIGS. 16 to 18. FIG. 15 is a flow chart for use in illustration of redundancy region removing portion 502. The maximum size value of a minute figure to draw is defined as input parameter, and a figure having a size not more than the maximum size is processed as a minute figure to draw. Each figure in the redundancy region and figure processing region is subject to the following processing so as not to generate a minute figure to draw by comparing to the positional relation between the figure processing region boundary and figure region. In FIGS. 16 to 18, a solid line region 630 defined by points W1 (wx1, wy1) and point W2 (wx2, wy2) is a figure processing region, a broken line 632 defines the boundary of a redundancy region, a region 634 defined by point P1 (x1, y1) and point P2 (x2, y2) is a figure region. Herein, the figure region is defined as a rectangular region externally in contact with a figure of interest. If the figure of interest is a rectangle, the figure data and figure region are in coincidence. If the figure of interest is a trapezoid, a rectangular region 642 close to the outer periphery of trapezoid 640 is a figure region as shown in FIG. 19.

Referring to FIG. 15, redundancy region removing portion 502 sequentially reads out figure data, comparing the positional relations between figure processing boundaries (left, right, lower and upper sides) and figure regions (600, 602, 604, 606, 610, 614, 618, 622), and performs a boundary processing (612, 616, 620, 624) if a figure region strides over a figure processing region boundary (FIG. 16). As indicated by steps 600 and 610, for example, if x1<wx1 and wx1<x2, the left side of the figure region is on the left of the left side of the figure processing region, while the right side of the figure region is on the right of the left side of the figure processing region, and therefore the figure region can be determined as striding over the left side of the figure processing region. The figure data is subject to left side boundary processing 612. Similarly, if the figure region strides over the right, lower and upper sides of the figure processing region, a right side boundary processing 616, a lower side boundary processing 620 and an upper side boundary processing 624 are performed, respectively. The boundary processing will be detailed later.

If the figure region is present between the redundancy region boundary and the figure processing region boundary (FIG. 17), the figure data is not output. If the figure region is present within the figure processing region (FIG. 18), the figure data is output as is.

Now, boundary processings 612, 616, 620 and 624 will be described. During a boundary processing, a figure portion overlapping another figure portion within the redundancy region is removed so as not to generate a minute figure to draw. Each figure processing region has a redundancy region, and its figure portion striding over an adjacent figure processing region also belongs to the adjacent figure processing region. The overlapping figure portion in the redundancy region can be removed independently for each figure processing region based on a predetermined procedure so as not to generate a minute figure to draw the procedure will be described below.

Left side boundary processing 612 shown in FIG. 15 will be described in conjunction with FIGS. 20 to 23. Referring to FIG. 20, the left side of a figure region 650 is on the left of figure processing region 630 by a distance of d1, and the right side of figure region 650 is on the right of the left side of figure processing region 630 by a distance of d2. Note that the left side of figure region 650 is on the right of the left side boundary of redundancy region 632.

Referring to FIG. 21, left side boundary processing 612 for the drawing field is determined based on the relation between distances d1 and d2 representing the relation of the X-coordinate of the figure and the X-coordinate of the drawing field boundary (left side) and size ϵ given from external parameters. Size ϵ is an input maximum size value for a minute figure to draw. In this left side boundary processing, all the four kinds of positions 660A to 660D shown in FIG. 22 will be considered as the relation between a figure and a figure processing region. Herein, at position 660A, the width of a figure portion provisionally divided by a figure processing region boundary at the left side is not more than minimum size value ϵ for minute figure to draw. At position 660B, the width of a figure portion similarly divided at the right side is not more than maximum size value ϵ. At position 660C, the widths of the divisions of the figure are each larger than maximum size value ϵ. At position 660D, the widths of both divisional figures are not more than maximum size value ϵ.

Referring to FIG. 22, it is determined in step 612A whether the distance d2 between the X-coordinate x2 of point P2 in the figure and the X-coordinate wx1 of the boundary left side is larger than ϵ. If distance d2 is not larger than ϵ (as at positions 660B and 660D in FIG. 22), the figure is removed from the drawing field. If distance d2 is larger than ϵ, it is determined in step 612B whether the distance d1 between the X-coordinate x1 of point P1 and the boundary left side is larger than ϵ. If d1 is not larger than ϵ, the figure data is output as is and the control transits to the next boundary processing (as at position 660A in FIG. 22). If distance d1 is larger than ϵ, the X-coordinate x1 of point P1 in the figure is corrected into wx1 to obtain a new point P1' (wx1, y1) in step 612C, and the control transits to the next boundary processing (as at position 660C in FIG. 22).

The results of boundary processings to the figures shown at positions 660A to 660D in FIG. 22 are shown in FIG. 23. As shown in FIG. 23, a figure 662A results at position 660A, and a figure 662C results at position 660C. No figure results at positions 660B and 660D. The processing for position 660C in FIG. 22 is common to any side of the figure processing region boundary where a figure is divided on a figure processing region boundary and no minute figure to draw is generated. In this case, the figure is divided by the figure processing region boundary, and only the figure remaining within the figure processing region is output (figure 662C in FIG. 23).

If a figure is divided by a figure processing region boundary, and one of the divisional figures is a minute figure to draw (positions 660A and 660B in FIG. 22), the processing principally proceeds as follows. If the figure remaining inside the figure processing region being currently processed as a result of dividing is a minute figure to draw (at position 660B in FIG. 22), no figure will be output. If the figure remaining in an adjacent figure processing region but not in the figure processing region of interest as a result of dividing (at position 660A in FIG. 22), the figure is not divided by the figure processing region boundary and output as is (figure 662A in FIG. 23).

As the case of position 660D in FIG. 22, figures resulting from the dividing are both minute figures to draw in any of the two adjacent figure processing regions across the boundary of the figure processing region of interest, the figures themselves will not be left by the above processing. In order to cope with the disadvantage, the side to output the figure is predetermined. For example, a figure is output without being divided at the right and upper sides of the figure processing region boundary, and left and lower sides are predefined not to output any figure. Then, the figure will be included in one of adjacent figure processing regions and not included in the other. In the following description, if figures resulting from dividing are both minute figures to draw, the figures are output according to the above described rule.

Right side boundary processing 616 shown in FIG. 15 is the same as left side boundary processing 612. Referring to FIG. 24, the boundary processing of the right side of the drawing field is determined based on the relations among distances d2 and d1 between the X-coordinates x1 and x2 of figure 650 and the X-coordinate wx2 of the right side of figure processing region 630 and size ε. The flow chart of right side boundary processing 616 is given in FIG. 25. In the following description, it is assumed that a figure is present at any of the positions 664A, 664B, 664C and 664D shown in FIG. 26. These positions correspond to positions 660A, 660B, 660C and 660D, respectively shown in FIG. 22 related to the left side boundary processing.

Referring to FIG. 25, during right side boundary processing 616, it is determined in step 614A whether distance d1 between the X-coordinate x2 of point P2 in the figure and the boundary right side is larger than ε. If distance d1 is not larger than ε, the figure is output as is and the control transits to the next boundary processing. Positions 664B and 664D shown in FIG. 26 correspond to such a case. If distance d1 is larger than ε, it is determined in step 614B whether distance d2 is larger than ε. If distance d2 is not larger than ε, the figure is removed from the drawing field. This corresponds to position 664A in FIG. 26. As shown in FIG. 27, the figure is not output in this case.

If it is determined in step 614B that distance d2 is larger than ε (the case of position 664C in FIG. 26), the X-coordinate x2 of point P2 in the figure is corrected to wx2 to obtain point P2' (wx2, y2), and the control transits to the next boundary processing. A figure 666C in FIG. 27 results from the processing.

Lower side boundary processing 620 and upper side boundary processing 624 are the same as left side boundary processing 612. Referring to FIG. 28, lower side boundary processing 620 is determined based on the relation among the Y-coordinates y1 and y2 of a figure, the Y-coordinate wy1 of the lower side of drawing field 630 and size ε. The flow chart in FIG. 29 will be described. Possible positions of figures are given in FIG. 30. Positions 668A to 668D shown in FIG. 30 correspond to positions 660A to 660D in FIG. 22, respectively.

Referring to FIG. 29, it is determined in step 622A whether distance d2 between the Y-coordinate y2 of point P2 in the figure and the boundary lower side is larger than ε. If distance d2 is not larger than ε, the figure is removed from the drawing field. This corresponds to the cases of positions 668B ad 668D in FIG. 30. In this case, no corresponding figure is left as shown in FIG. 31.

If distance d2 is larger than ε, it is then determined in step 622B whether distance d1 between the Y-coordinate y1 of point P1 in the figure and the boundary lower side is larger than ε. If distance d1 is not larger than ε, the figure data is output as is. This case corresponds to positions 668A and 668D in FIG. 30. Note however that if figures remaining in two adjacent figure processing regions across the boundary as a result of dividing are both minute figures to draw, only the upper side figure is left as described above and the lower side figure will not be output. As the result of the processing, a figure 670A in FIG. 31 is left.

If distance d1 is larger than E (positions 668B and D in FIG. 30), the Y-coordinate of point P1 in the figure is corrected to wy1 to obtain a point P1' (x1, wy1) and the figure data is output (and the process transits to the next boundary processing). As a result, figures 670B and 670D shown in FIG. 31 result.

Upper side boundary processing 624 is as follows. Referring to FIG. 32, the upper side boundary processing is determined based on the relation among the Y-coordinates y1 and y2 of figure 650, the Y-coordinate wy2 of the upper side of figure processing region 630 and size ε. The processing flow is given in FIG. 33. The positions of figures which will be described below are shown in FIG. 34, and the result of the upper side boundary processing is given in FIG. 35. Positions 672A to 672D in FIG. 34 correspond to positions 660A to 660D, respectively in FIG. 22 which is associated with left side boundary processing 612.

Referring to FIG. 33, it is determined in step 624A whether distance d1 between the Y-coordinate y2 of point P2 in the figure and the boundary upper side is larger than ε. If distance d1 is not larger than ε, the figure data is output as is (and the boundary processing completes). At the time, a figure 674B and a figure 674D shown in FIG. 35 are output. Figure 674D, though divided into minute figures to draw, is output according to the above-described rule, because it is positioned on the upper side of figure processing region 630.

If distance d1 is larger than ε, it is determined in step 624B whether distance d2 between the Y-coordinate y1 of point P1 in the figure and the boundary upper side is larger than ε. If distance d2 is not larger than ε, the figure is removed from the drawing field. This corresponds to position 672A in FIG. 34.

If distance d2 is larger than ε, the Y-coordinate of point P2 in the figure is corrected to wy2 to obtain a point P2' (x2, wy2), the figure data is output (and the boundary processing completes.) This corresponds to position 672C in FIG. 34. A figure 674C shown in FIG. 35 is output as a result.

The processing by redundancy region removing portion 502 proceeds as described above. The processing by allocating portion 508 for drawing field is substantially identical to the processing by redundancy region removing portion 502 except that a figure is allocated to the drawing field rather than to the figure processing region.

Basic figures allocated to figure processing regions are again merged by figure data merge portion 504 into basic figure data 506 for the entire design data. Among all the basic figures, those to be collected as a set of data are subject to a processing to combine them as one figure, followed by another basic figure dividing. Drawing field allocating portion 508 allocates basic figure data 506 to drawing fields. The method of allocating is substantially identical to the method of allocating figures by redundancy region removing portion 502. The flow of the processing by allocating portion 508 to the drawing fields is given in FIGS. 36 and 37. Referring to FIG. 36, basic figure data 506 is input (380). It is determined whether or not the following allocating processing has been completed to all the basic figures (382). If the processing has been completed to all the basic figures, the allocating processing completes. If the processing has not been completed, it is determined if a basic figure to be processed is a trapezoid (384). If the figure is a trapezoid, the control proceeds to step 590 and allocates the basic figure to each drawing field according to the method of allocating a trapezoid, and if the figure is not a trapezoid, the control proceeds to step 402 and basic figures are allocated to drawing fields according to the method of allocating for figures other than trapezoid. Then, the process returns to step 380, and the above-described processing is repeated for all the basic figures. The method of processing a figure other than a trapezoid 402 is the same as that shown in FIG. 15. Note that in the following description, "trapezoid" refers to a figure having upper and lower bases parallel to the upper and lower sides of a drawing field, and at least one side inclined relative to the right or left side of the drawing field.

Referring to FIG. 37, during the processing of allocating a trapezoid, it is determined if the trapezoid is present across the boundary of the upper end or lower end of the field (386). If the trapezoid is at the upper end or lower end of the field, the control proceeds to step 388, and field upper end or lower end boundary trapezoid incorporating processing is performed (388). The processing itself is the same as a normal allocating processing.

Now, it is determined whether an inclined side of a trapezoid of interest is on the left end or right end boundary of the drawing field (390). If the inclined side of the trapezoid is not on the left end or right end boundary, the control proceeds to step 400 and outputs a basic figure, thus completing the processing. If there is an inclined side of the trapezoid across the left end or right end boundary, the control proceeds to step 680. In step 680, the intersection of the inclined side and the drawing field boundary is obtained, and the trapezoid is divided by a horizontal line through the intersection. In step 398, individual trapezoids resulting from the dividing are subject to drawing field left end or right end boundary trapezoid incorporating processing. The boundary trapezoid incorporating processing is the same as the processing shown in FIG. 15. When the process in step 398 completes, a resulting basic figure is output (400), thus completing the processing.

All the basic figure data is allocated to drawing fields, electron beam drawing data is formatted into a form which can be used by an electron beam drawing apparatus using an electron beam drawing data format portion 122, and electron beam drawing data 512 is obtained. Electron beam drawing data format portion 122 is different between electron beam drawing apparatuses to use.

By the above-described conventional technique, a minute figure to draw is sometimes generated upon dividing a figure into basic figures at basic figure processing portion 106 shown in FIG. 12. Such an example will be described in conjunction with FIGS. 38 to 40. The procedure of dividing a figure 274 shown in FIG. 38 into basic figures will be considered. In this case, as shown in FIG. 39, dividing lines 690 to 700 are drawn horizontally from the vertexes of figure 274. As a result, figure 274 is divided into five rectangles 310, 312, 314, 316 and 318 shown in FIG. 40. Rectangles 314 and 318 are obtained as minute figures to draw by this dividing, and if electron beam drawing is performed to this pattern, the size precision degrades as described above. A similar problem is sometimes encountered as a result of sizing a figure. In order to solve such a disadvantage, it is desirable to remove thus formed minute figure to draw and converted into a basic figure as large as possible and to form charged beam drawing data.

Furthermore, the above described conventional technique suffers the following problem. In this technique, upon allocating basic figures to the figure processing regions or drawing fields, a figure in a redundancy region must be treated equally from both adjacent figure processing regions. However, if design layout data including inclined lines is input, a further problem not mentioned above is sometimes generated. This is because such a figure is processed separately in adjacent figure processing regions.

The contour of the figure in the redundancy region should be recognized as the same figure in an adjacent figure processing region. However, the above-described basic figure dividing processings are separately performed in figure processing regions, and the same figure could be divided differently between adjacent figure processing regions. As a result, the originally identical figures could be recognized as different figures between these adjacent figure processing regions. In such a case, the figures sometimes cannot be allocated correctly. This problem will be further detailed below.

FIG. 41 shows a kind of LSI design layout data, figure data 710. Figure data 710 includes regularly arranged inclined rectangular figures 712. Figure data 710 is divided into a plurality of figure processing regions including redundancy regions by figure processing region dividing portion 102 as shown in FIG. 42 at (A). Thereafter, basic figure dividing is performed for each figure processing region.

Figure processing regions 714 and 716 in FIG. 42 at (A) are shown in enlarged form in FIG. 42 at (B). Referring to FIG. 42 at (B), figure processing regions 714 and 716 in solid line are attached with redundancy regions 718 and 720, respectively in dotted line. In the following description, for the ease of description and illustration, only figure 712 across the figure processing region boundary will be specifically described. Figure 712 is extracted in FIG. 43.

A result of basic figure processing by left side figure processing region 714 to figure 712 is given in FIG. 44. Referring to FIG. 44, figure 712 has its center at the right side of figure processing region 714 and divided into basic figures 722, 724 and 726 by based on intersections with two straight lines 748 spaced apart from each other by minimum size value $\epsilon$ for minute figure to draw in the horizontal direction.

The result of dividing figure 712 into basic figures in figure processing region 716 on the right side is shown in FIG. 45. Referring to FIG. 45, figure 712 has its center at the left side of figure processing region 716 and divided into basic figures 728, 730 and 732 based on intersections with two straight lines 748 spaced apart by minimum size value $\epsilon$ for minute figure to draw in the horizontal direction.

The result of allocating figures in the redundancy region by redundancy region removing portion 502 is given in FIGS. 46 and 47. FIGS. 46 and 47 correspond to FIGS. 44 and 45, respectively. Referring to FIG. 46, the original figure 712 is divided into figures 722 and 734. Figure 726 in FIG. 44 is removed. Figure 734 is produced by removing the redundancy region portion of figure 724 shown in FIG. 44. In FIG. 47, the original figure 712 is divided into figures 732 and 736. Figure 728 shown in FIG. 45 is removed. Figure 736 is produced by removing the redundancy region portion of figure 730 in FIG. 45.

The figures shown in FIGS. 46 and 47 are subject to figure data merge, and once again divided into basic figures for allocation to drawing fields, and the results are shown in FIGS. 48 and 49. Left side figure processing region (which corresponds to the drawing field) 714, the original figure is divided into basic figures 722, 740 and 742. In the right side figure processing region 716, the original figure is divided into basic figures 744, 746 and 732 as shown in FIG. 49.

FIG. 50 shows a figure formed by combining those figures in FIGS. 48 and 49. As can be seen from FIG. 50, the final figure data have missing portions, which degrades the size precision of the drawing pattern.

A similar problem will be described in conjunction with FIGS. 51 to 85. A figure 750 shown in FIG. 51 will be allocated to two adjacent figure processing regions over a boundary 752. The redundancy region boundary 718 of left side figure processing region, the boundary 720 of the right side figure processing region and two straight lines 748A and 748B spaced apart from boundary 752 by minimum size value $\epsilon$ for minute figure to draw are positioned as shown.

Referring to FIG. 52, the basic figure dividing and the redundancy region removing processing in the left side figure processing region, figure 750 shown in FIG. 51 is divided into four basic figures 752, 754, 756 and 758. Figures 752 and 754 are allocated to the left side figure processing region. Meanwhile, referring to FIG. 53, by the basic figure dividing and redundancy region removing processings in the right side figure processing region, figure 750 shown in FIG. 51 is divided into three figures 762, 764 and 766. Figure 764 cannot be allocated to the right side figure processing region, because the right end of figure 764 does not reach straight line 748B on the right side. As a result, only figure 766 is allocated to the right side figure processing region. The result of allocating the figures is shown in FIG. 54. As can be seen from FIG. 54, figure part 768 is missing in the right side figure processing region. The size precision of drawing pattern is thus lowered.

Furthermore, since the trapezoid having an inclined side is subject to the allocating processing as shown in FIG. 35, the following problem is encountered. Referring to FIG. 55, let us now consider that a trapezoid 780 is divided by the boundary 752 of a figure processing region. Trapezoid 780 is once divided into a triangle 782 on the left side and a pentagon on the right side by boundary 752 as shown in FIG. 56. The pentagon on the right side is then divided into a trapezoid 784 and a rectangle 786 by a dividing line extended horizontally from the intersection of the inclined side and boundary 752. In the positional relation as shown in FIG. 56, trapezoid 784 having a height smaller than minimum size value $\epsilon$ for minute figure to draw becomes a minute figure to draw, thus lowering the size precision of the drawing pattern.

SUMMARY OF THE INVENTION

It is therefore an object of the invention to provide a method of producing charged beam drawing data allowing the generation of minute figures to draw to be reduced during processing figures, and improvement of the size precision of drawing data.

Another object of the invention is to provide a method of producing charged beam drawing data allowing the generation of minute figures to draw to be reduced during processing figures, the generation of minute figures to draw to be reduced at the time of allocating basic figures in the vicinity of boundaries of drawing fields to the drawing fields, and improvement of the size precision of drawing data.

Yet another object of the invention is to provide a method of producing charged beam drawing data allowing the generation of minute figures to draw to be reduced during processing figures while reducing associated processing loads and producing drawing data with improved size precision at a high speed.

An additional object of the invention is to provide a method of producing charged beam drawing data allowing the generation of minute figures to draw to be reduced during processing figures and effective improvement of the size precision of drawing data.

Another additional object of the invention is to provide a method of producing charged beam drawing data allowing the generation of minute figures to draw to be reduced during processing figures, while reducing processing loads and producing drawing data at a high speed with the trade off with the size precision being solved.

A method of producing charged beam drawing data according to the present invention includes a basic figure processing step of performing a basic figure processing to design layout data to output basic figure data, a first segmenting step of transforming the basic figure data as if segmenting a basic figure across a boundary of a figure processing region by the boundary, a first search step of searching a minute figure to draw which satisfies a prescribed condition among figures produced by the first segmenting step, a restoring step of integrating the minute figure to draw searched and found by the first search step and a figure adjacent to the minute figure to draw, and further performing a basic figure processing to restore the figures within the basic figure data, a step of allocating the figures thus restored by the restoring step to drawing fields, and a step of transforming the figures allocated by the allocating step into charged beam drawing data.

The basic figure processing step transforms design layout data into basic figure data. The first segmenting step transforms a basic figure across a boundary of a figure processing region into basic figure data as if segmenting the figure. The first search step searches a minute figure to draw which satisfies a prescribed size condition among the figures produced by segmenting the first segmenting step. The searched and found minute figure to draw is integrated with a figure adjacent to the minute figure by the restoring step into a larger figure, and further subjected to a basic figure processing. The basic figure data is restored into a state without any minute figure to draw. In the allocating step, the figures restored by the restoring step are allocated to drawing fields, and the figures are transformed into charged beam drawing data.

A basic figure on a boundary of a figure processing region is segmented by the boundary in the first segmenting step, no overlapping figure portion is generated at the boundary, and therefore no missing portion in the figure resulting from the removal of overlapped figure portions will be generated unlike conventional cases. Meanwhile, a minute figure to draw generated by segmenting the figure by the boundary in the first segmenting step is searched and found by the search step, integrated with a figure adjacent to the minute figure, and again subject to a basic figure processing. Therefore, less minute figures to draw are generated, and the size precision of drawing data can be improved.

The allocating step preferably includes a second segmenting step of segmenting a basic figure positioned across the boundary between drawing fields and occupying a region not less than a prescribed size in the drawing fields by the boundary, and a step of allocating figures formed by segmenting in said second segmenting step and basic figures not over the drawing field boundary to drawing fields.

In the second segmenting step, only a basic figure over a boundary of a drawing field and not allowing any minute figure to draw to be generated when segmented is segmented by the boundary of the drawing field. The figures produced by the segmenting are allocated to drawing fields. When the figures are allocated to the drawing fields, no minute figure to draw is newly generated over the boundary of the drawing field. Less minute figures to draw are generated, and therefore the size precision of drawing data can be improved.

More preferably, the restoring step includes a first proximate figure search step of searching a proximate figure having a degree of proximity of n (n: natural number not less than 2) among very minute figures searched and found by the first search step, and a step of grouping proximate figures searched and found by the first proximate figure search step for basic figure dividing.

A minute figure to draw is integrated with a proximate figure into a larger figure and divided into basic figures. The integrated larger figure permits higher flexibility in dividing into basic figures, and the integrated figure can be divided into basic figures such that minute figures to draw can be restrained. Thus, the generation of minute figures to draw is reduced. n=2 is optimum.

The method of producing charged beam drawing data may further include a step of repeating the restoration step until the degree of reduction of the length of remaining minute figures to draw saturates. Herein, the length of a minute figure represents the sum of portions minute figures in contact with another figure among minute figures which could adversely affect the precision.

After repeating the restoration processing a number of times, the remaining length of minute figures to draw is reduced. Meanwhile, at some point, thus repeating the restoration processing could no longer reduce the length of remaining minute figure to draw as much, in which case, any further restoration processing deems to be wasted. Therefore, if the restoration processing completes at the point when the degree of reducing the length of minute figures to draw is saturated, unnecessary processing will not be performed and minute figures to draw can be reduced as much as possible.

Alternatively, the restoration step is desirably performed a number of times, and in particular performing the step twice is practical.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 57:
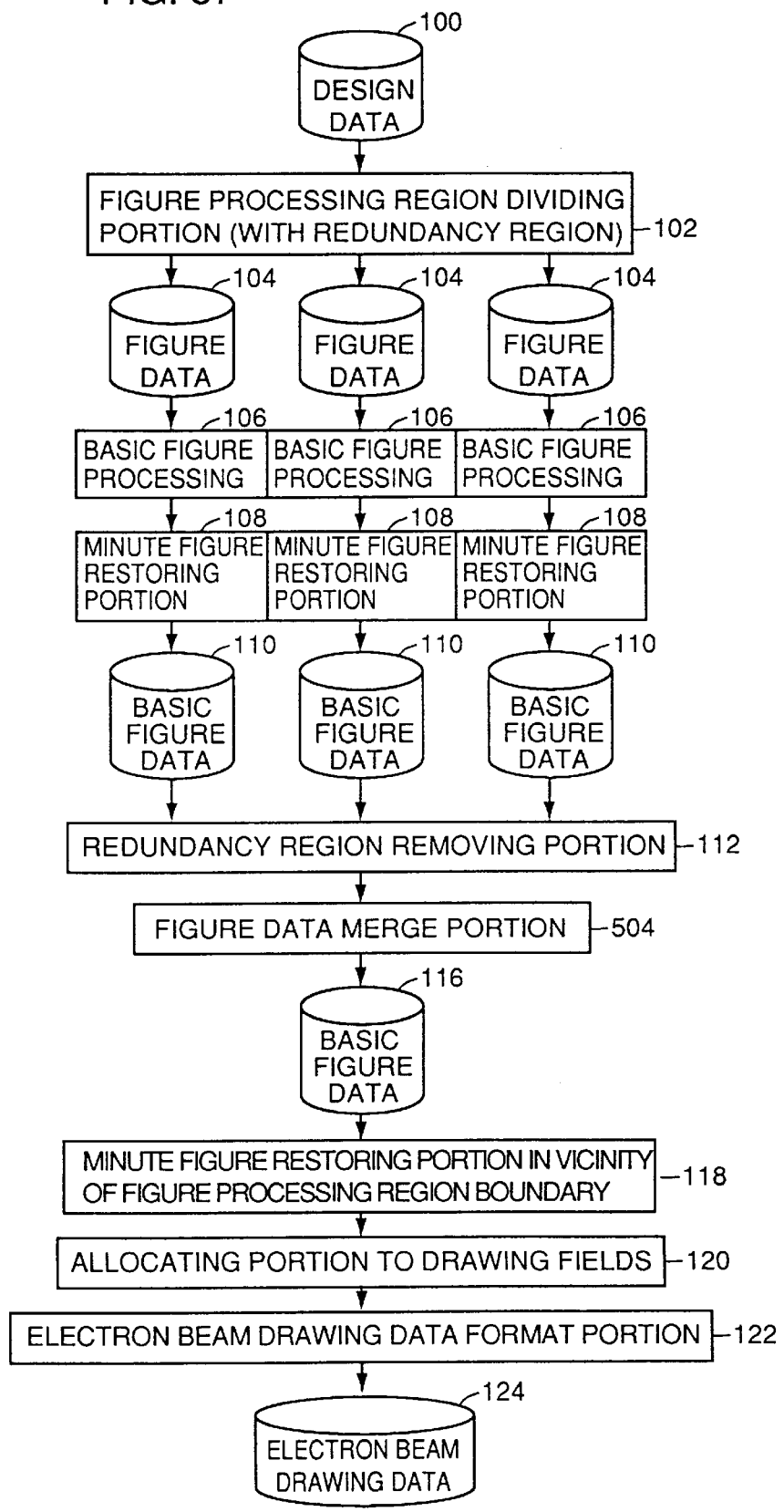
FIG. 57 is a block diagram for use in illustration of the entire function of a drawing data producing apparatus according to a first embodiment of the invention.

FIG. 57 is a block diagram showing the configuration of a charged beam drawing data producing apparatus and the flow of data for implementing a method of producing charged beam drawing data according to a first embodiment of the invention. The charged beam drawing data producing apparatus shown in FIG. 57 is substantially identical to the conventional apparatus shown in FIG. 12 except that succeeding to basic figure processing portions 106, there are additionally provided minute figure restoring portions 108 having the function of removing a minute figure to draw by searching a minute figure to draw resulting from a basic figure processing, integrating thus found minute figure with an adjacent figure, and again dividing thus integrated figure into basic figures in an optimum form, and a redundancy region removing portion 112 in place of redundancy region removing portion 502 shown in FIG. 12 for forcibly segmenting a figure over figure processing regions at a boundary of a figure processing region and allocating the segments to the two figure processing regions on both sides of the boundary.

Figure 1:
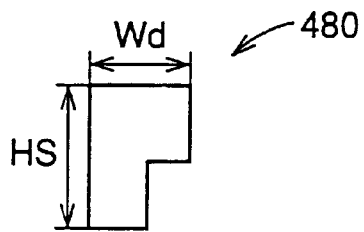
FIG. 1 is a diagram showing design layout data for use in illustration of a conventional procedure of producing a variable shaping type drawing data.
Figure 2:
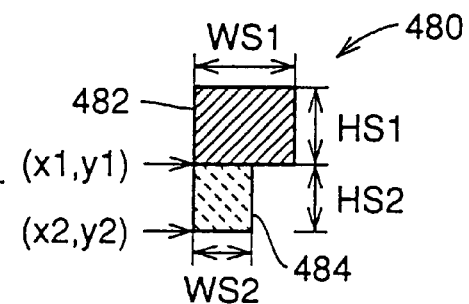
FIG. 2 is a diagram showing electron beam drawing data (horizontally divided) for use in illustration of the conventional variable shaping type drawing procedure.
Figure 3:
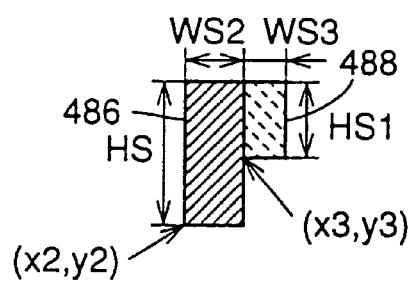
FIG. 3 is a diagram showing electron beam drawing data (vertically divided) for use in illustration of the conventional variable shaping type drawing procedure.
Figure 4:
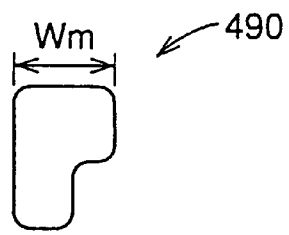
FIG. 4 is a diagram showing a resist pattern on a mask.
Figure 5:
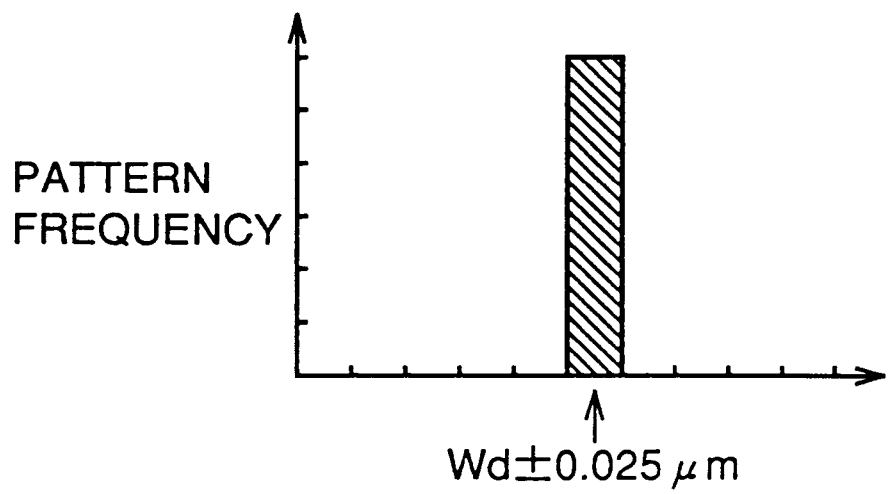
FIG. 5 is a graph showing dispersion in the size of a resist pattern on a mask drawn by one shot of electron beam.
Figure 6:
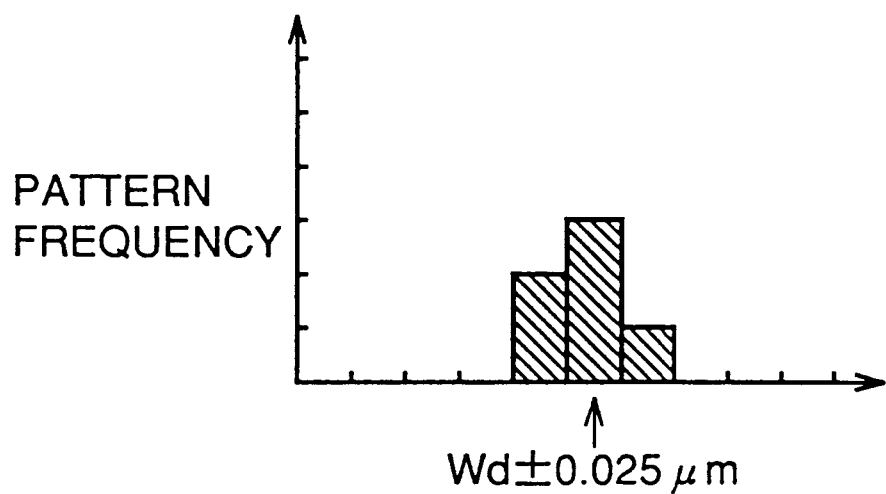
FIG. 6 is a graph showing dispersion in the size of a resist pattern on a mask drawn by two shots of electron beams.
Figure 7:
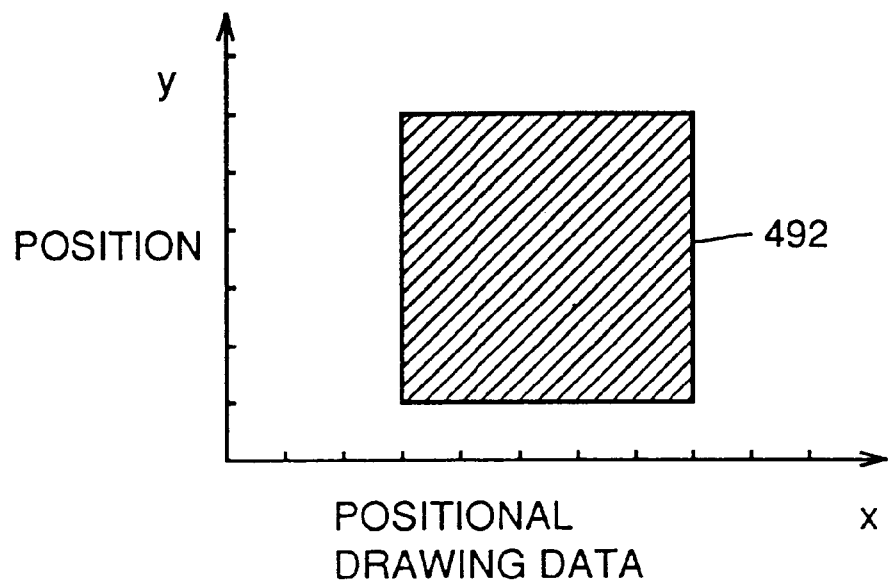
FIG. 7 is a diagram showing a figure drawn by one shot of electron beam.
Figure 8:
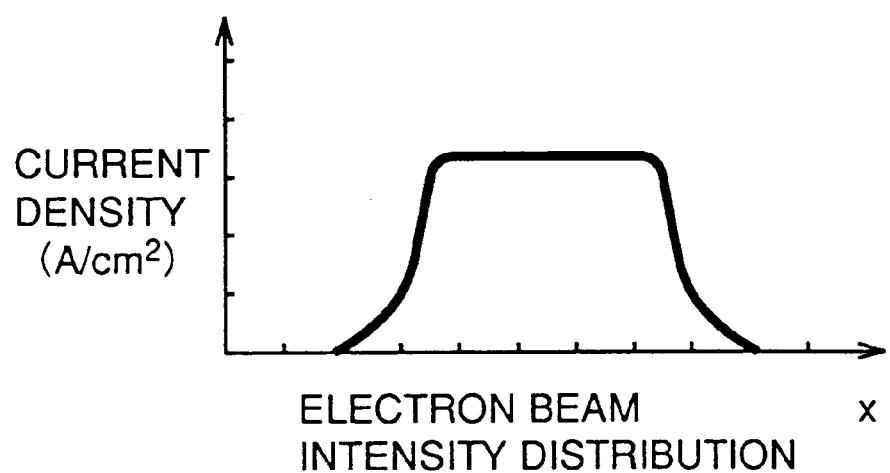
FIG. 8 is a graph showing the intensity of one shot of electron beam used for drawing.
Figure 9:
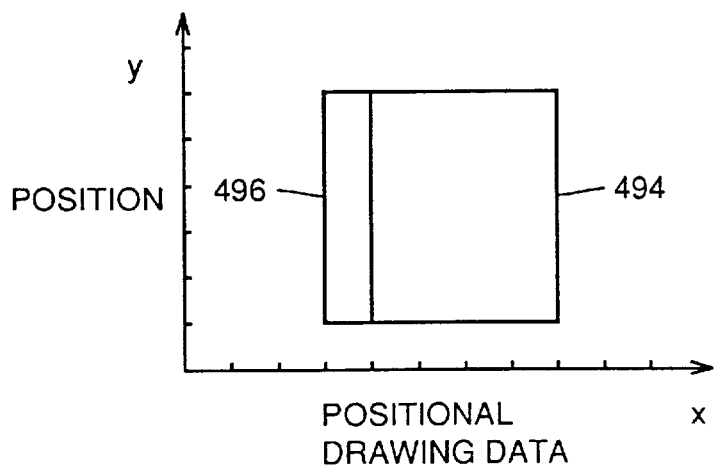
FIG. 9 is a diagram showing a figure drawn by two shots of electron beams.
Figure 10:
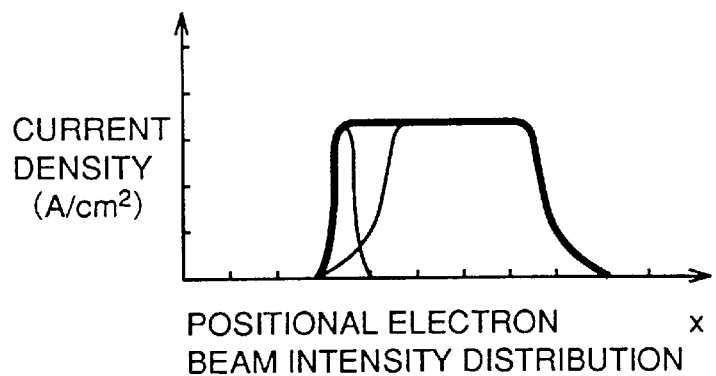
FIG. 10 is a graph showing the intensity distribution of two shots of electron beams used for drawing.
Figure 11:
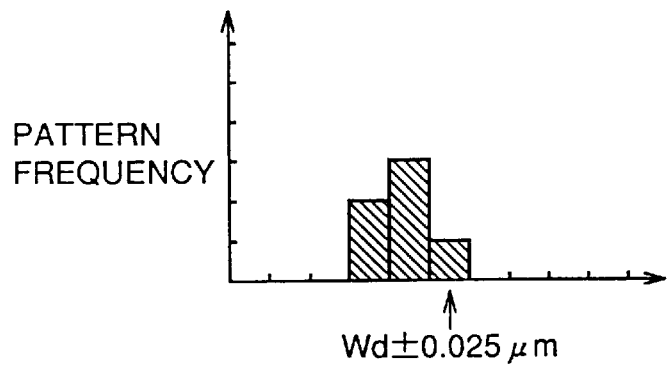
FIG. 11 is a graph showing dispersion in the size of a resist pattern in a very small size on a mask drawn by two shots of electron beams.
Figure 12:
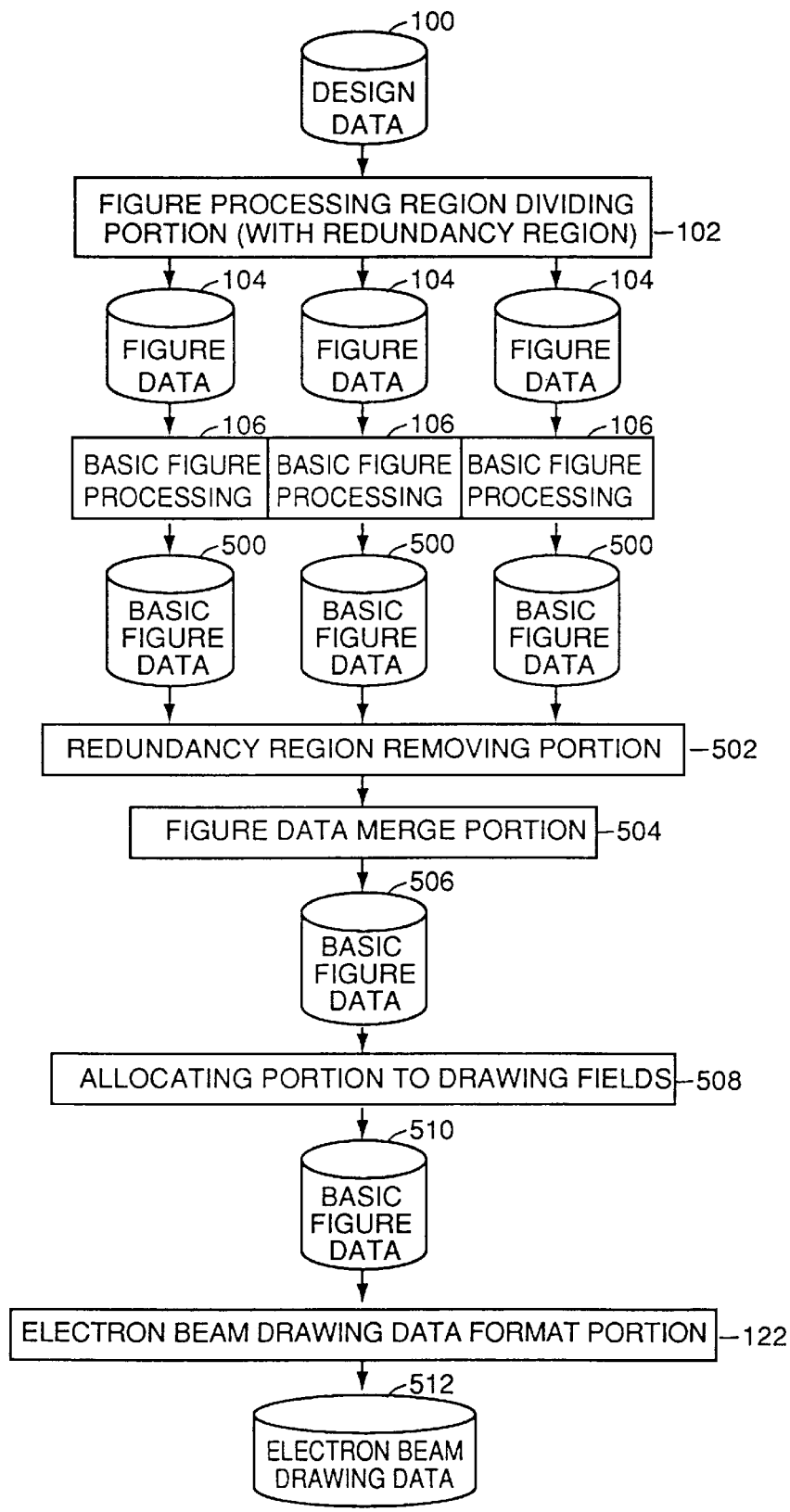
FIG. 12 is a block diagram for use in illustration of the entire function of a conventional electron beam drawing data producing apparatus.
Figure 13:
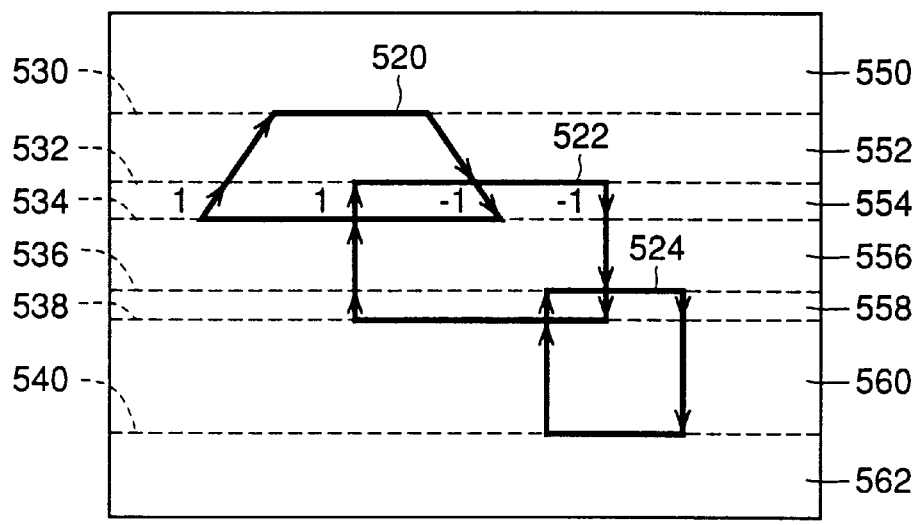
FIGS. 13 and 14 are diagrams for use in illustration of dividing and overlapped portion removing processing of figures according to the slab method.
Figure 14:
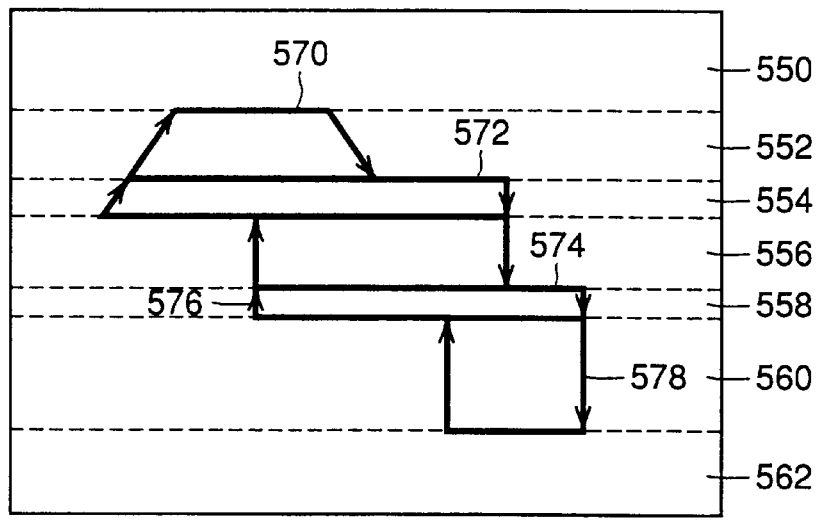
Figure 15:
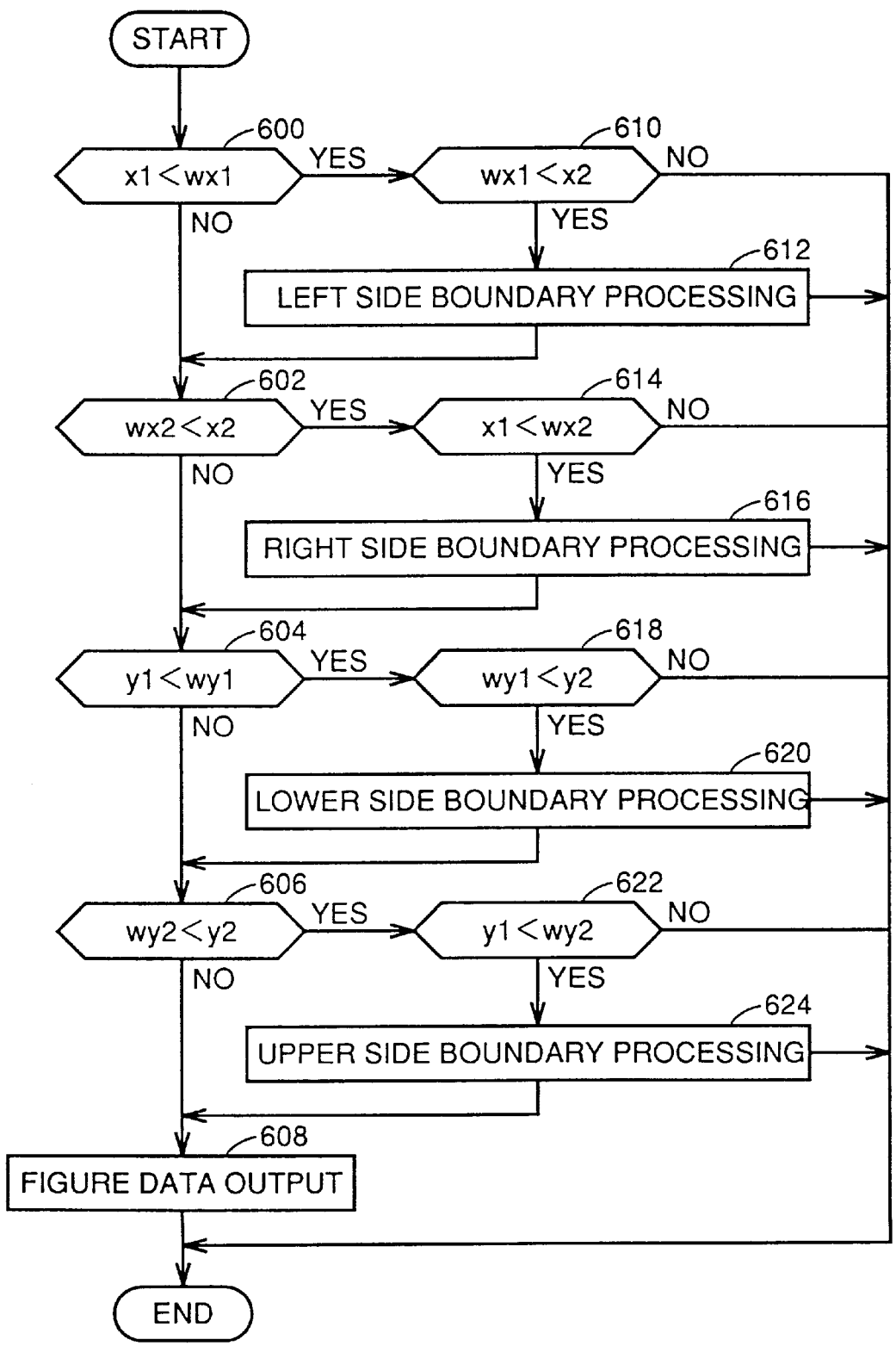
FIG. 15 is a flow chart for use in illustration of the processing of removing the figure processing region boundary redundancy region.
Figure 16:
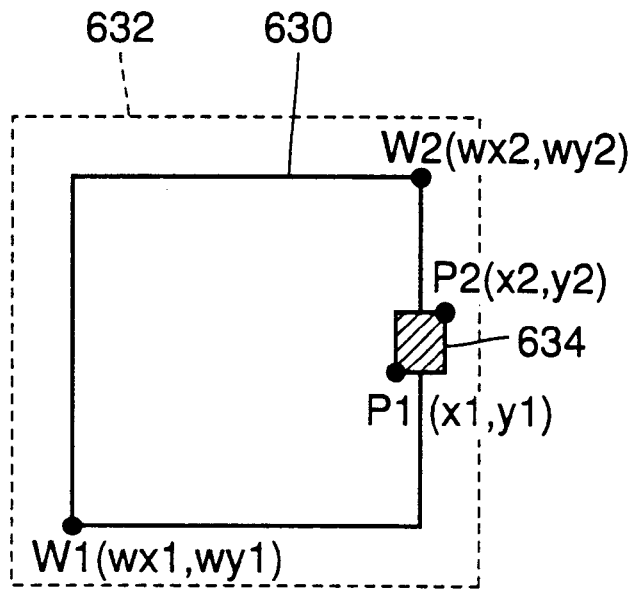
FIGS. 16 to 18 are diagrams for use in illustration of figures to be processed by the function of the figure processing region boundary redundancy portion removing processing.
Figure 17:
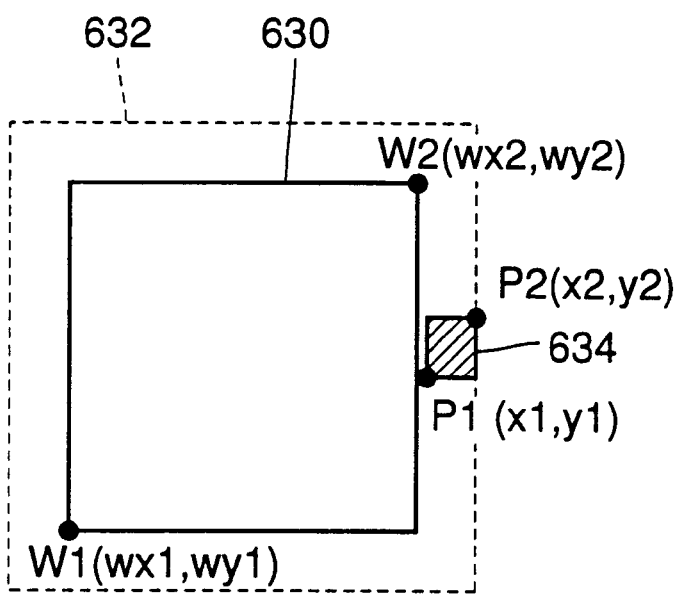
Figure 18:
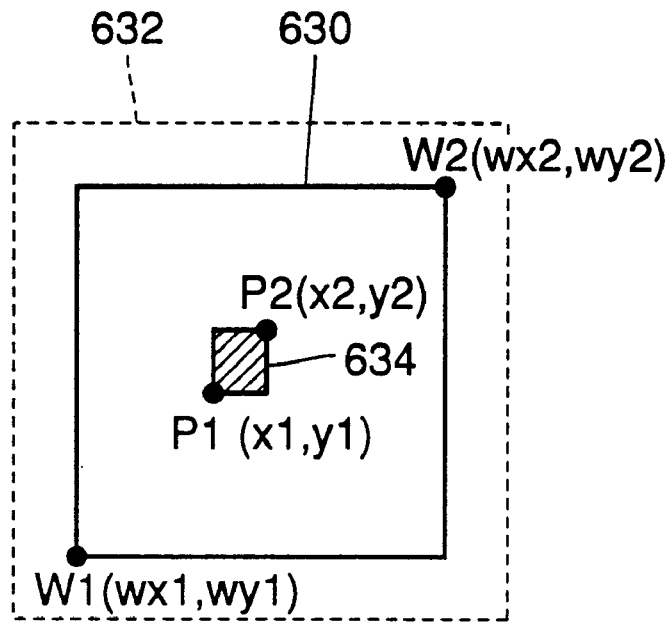
Figure 19:
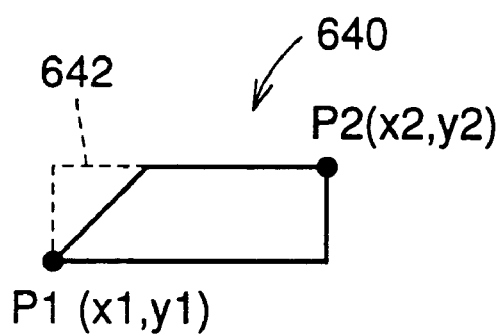
FIG. 19 is a diagram showing a figure region for a trapezoid.
Figure 20:
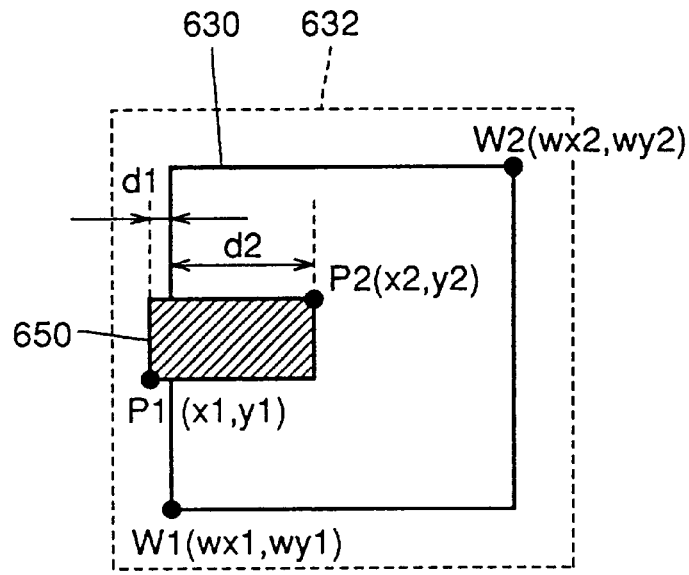
FIG. 20 is a figure for use in illustration of the boundary processing when a figure region is over the left side of the boundary of a figure processing region.
Figure 21:
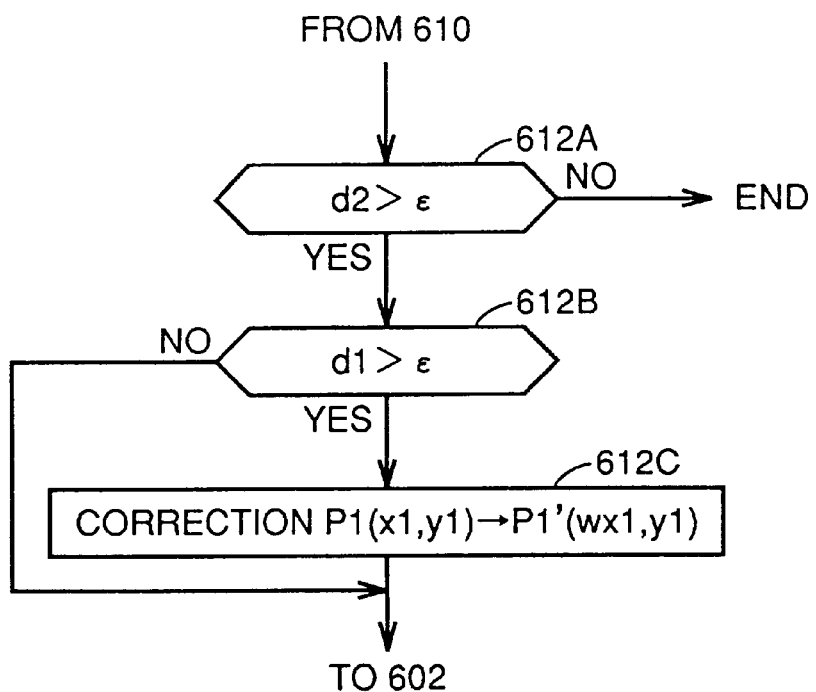
FIG. 21 is a flow chart for use in illustration of the boundary processing when a figure region is over the left side of a figure processing region boundary.
Figure 22:
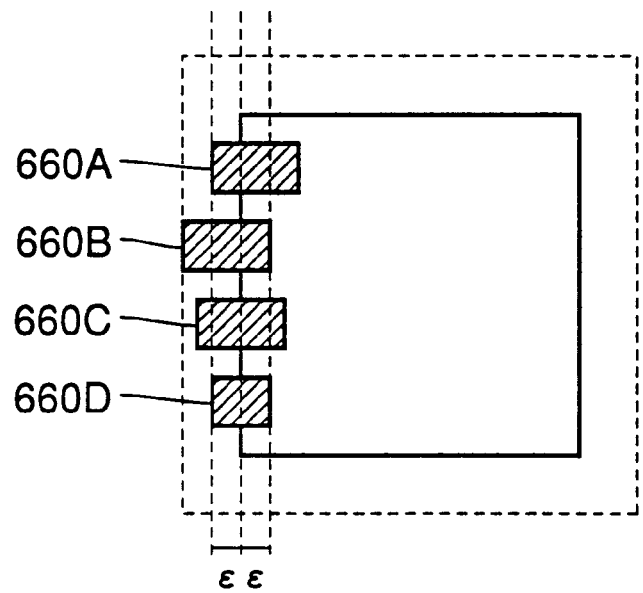
FIGS. 22 and 23 are diagrams for use in illustration of the boundary processing when a figure region is over the left side of a figure processing region boundary.
Figure 23:
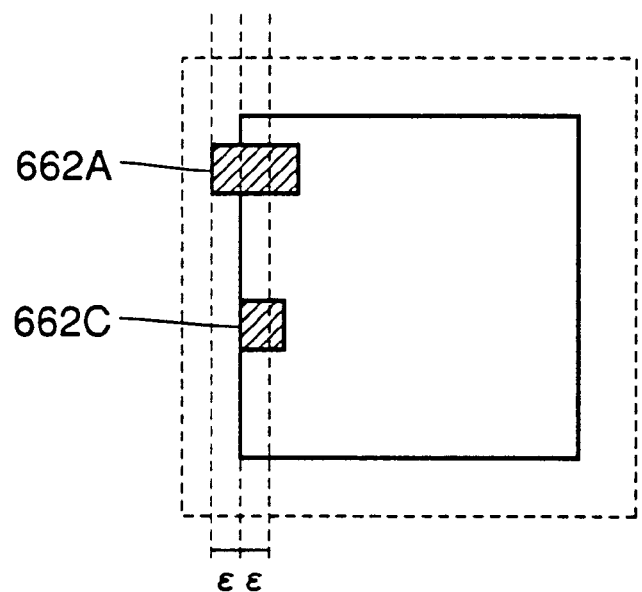
Figure 24:
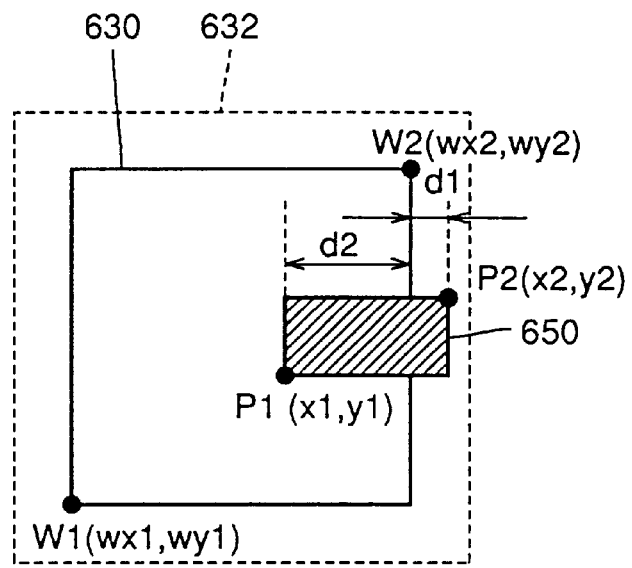
FIG. 24 is a diagram for use in illustration of the boundary processing when a figure region is over the right side of a figure processing region boundary.
Figure 25:
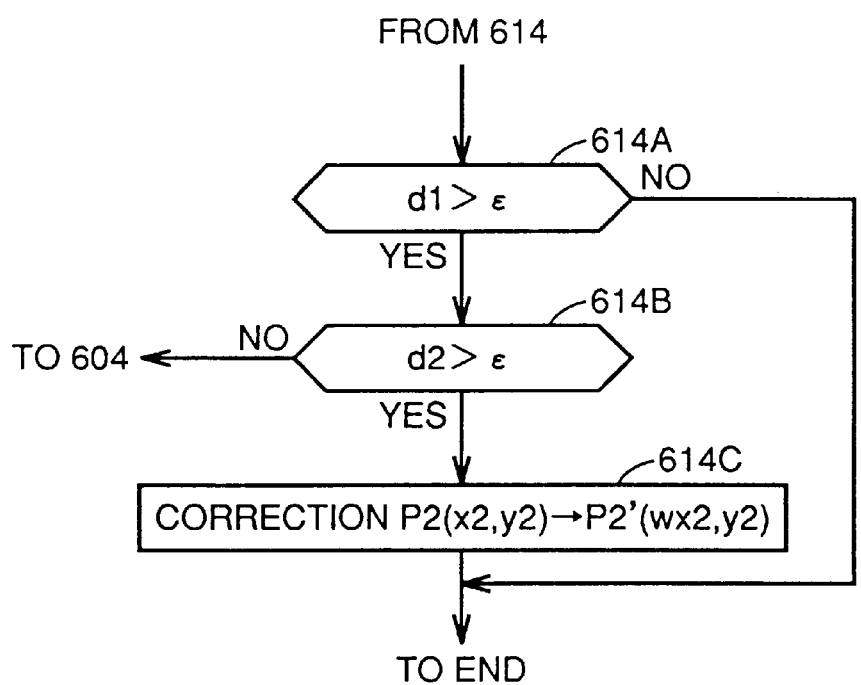
FIG. 25 is a flow chart for use in illustration of the boundary processing when a figure region is over the right side of the figure processing region boundary.
Figure 26:
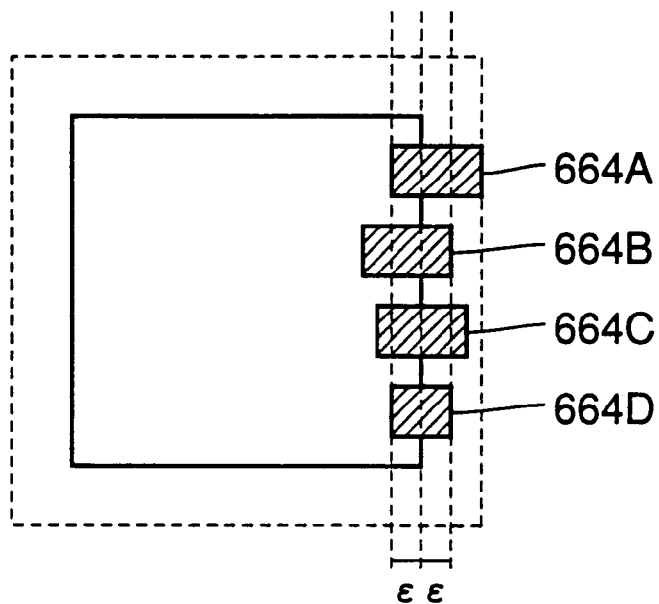
FIGS. 26 and 27 are views for use in illustration of the boundary processing when a figure region is over the right side of a figure processing region boundary.
Figure 27:
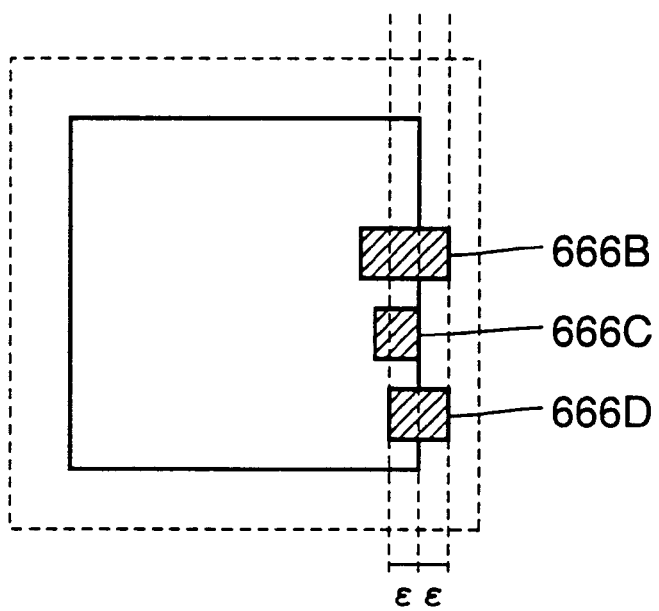
Figure 28:
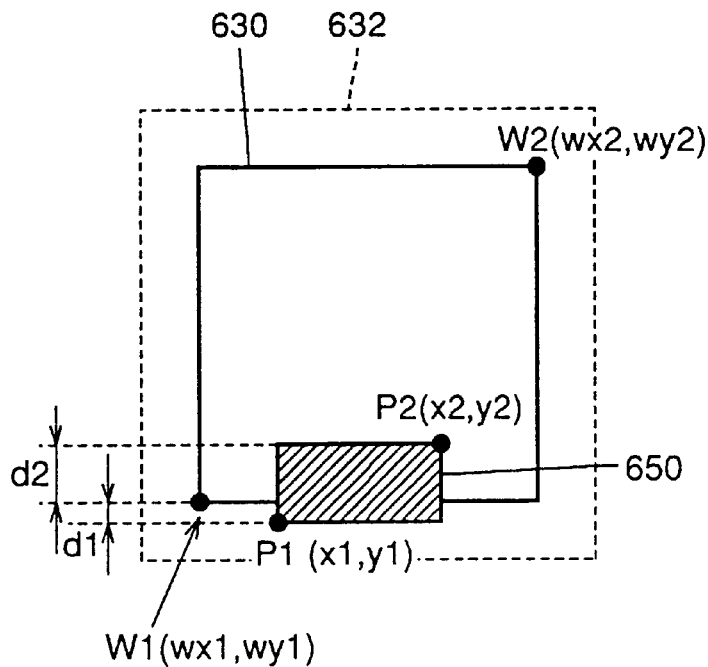
FIG. 28 is a diagram for use in illustration of the boundary processing when a figure region is over the lower side of a figure processing region boundary.
Figure 29:
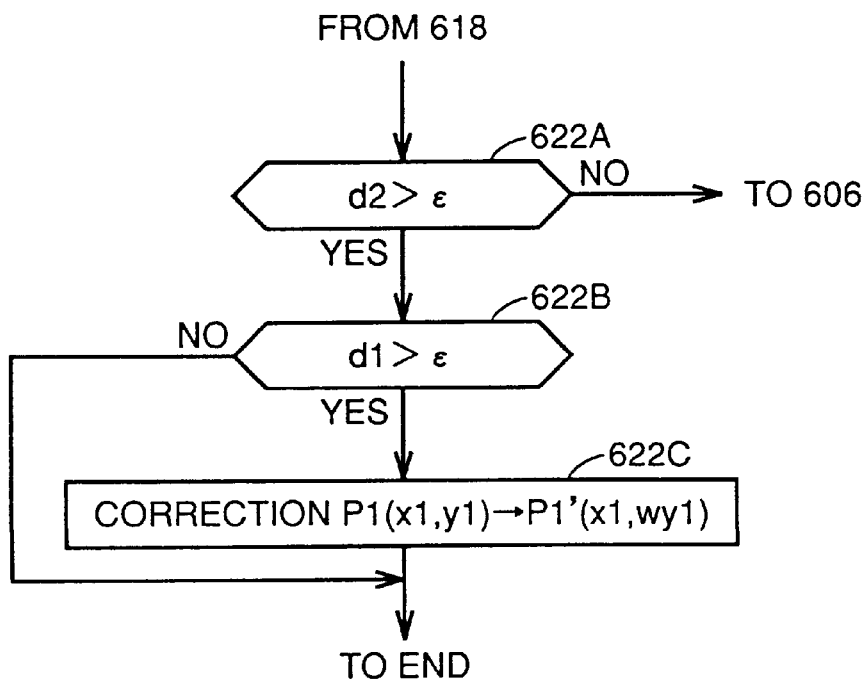
FIG. 29 is a flow chart for use in illustration of the boundary processing when a figure region is over the lower side of a figure processing region boundary.
Figure 30:
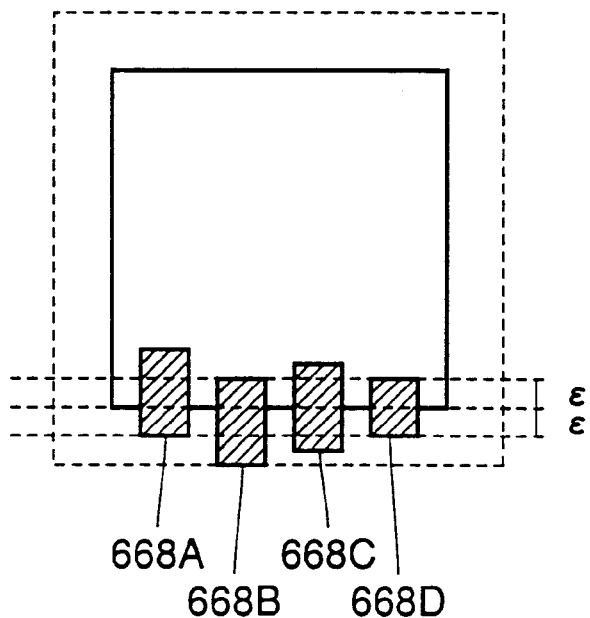
FIGS. 30 and 31 are diagrams for use in illustration of the boundary processing when a figure region is over the lower side of a figure processing region boundary.
Figure 31:
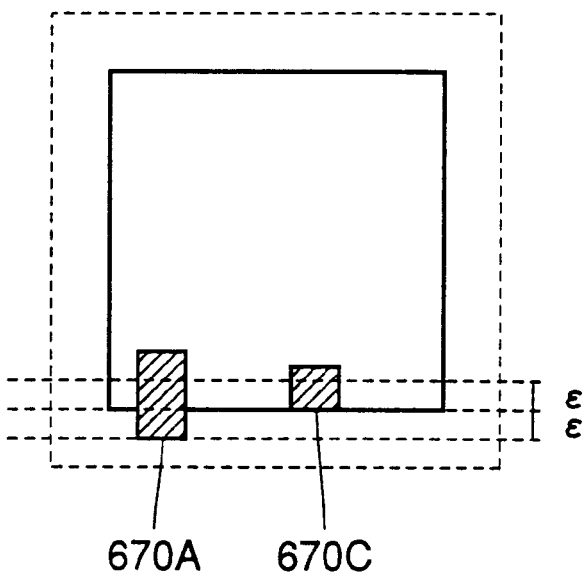
Figure 32:
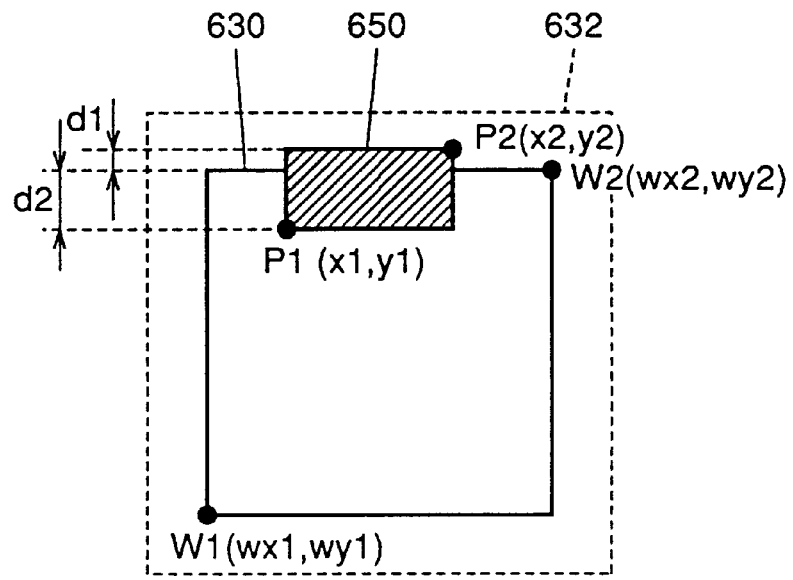
FIG. 32 is a diagram for use in illustration of the boundary processing when a figure region is over the upper side of a figure processing region boundary.
Figure 33:
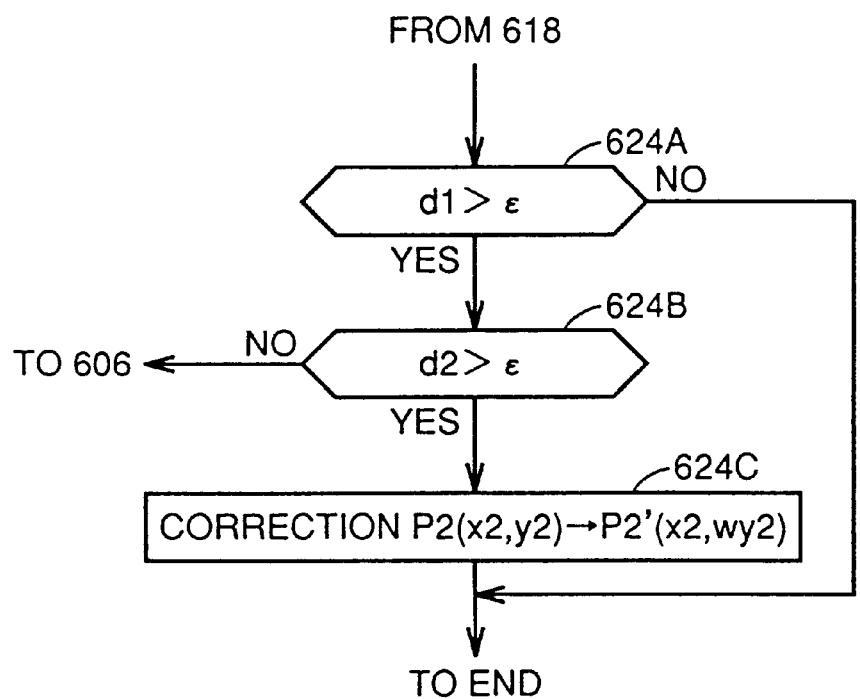
FIG. 33 is a flow chart for use in illustration of the boundary processing when a figure region is over the upper side of a figure processing region boundary.
Figure 34:
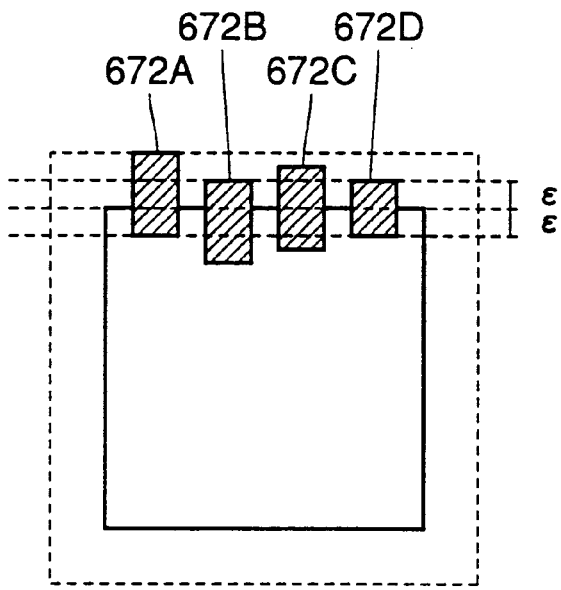
FIGS. 34 and 35 are diagrams for use in illustration of the boundary processing when a figure region is over the upper side of a figure processing region boundary.
Figure 35:
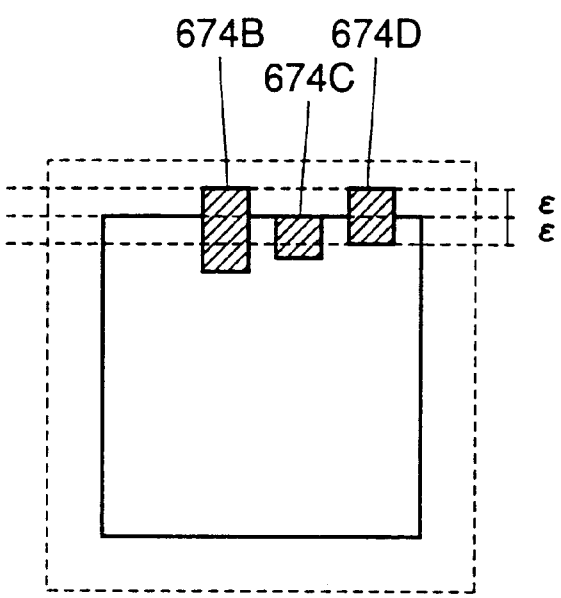

The apparatus according to the first embodiment further includes a minute figure restoring portion 118 placed preceding to allocating portion 508 to drawing fields shown in FIG. 12 for integrating a minute figure to draw searched and found in the vicinity of a boundary of a figure processing region with an adjacent figure, thereby removing the minute figure to draw in the vicinity of the boundary of the figure processing region, and an allocating portion 120 capable of improved processing of allocating a trapezoid at an inclined line of the trapezoid to a drawing field in place of allocating portion 508 shown in FIG. 12.

Redundancy region removing portion 112 does not perform a boundary processing to a figure over a boundary of a figure processing region unlike conventional redundancy region removing portion 502, but segments all the figures over the boundary of the figure processing region by the boundary.

Figure 58:
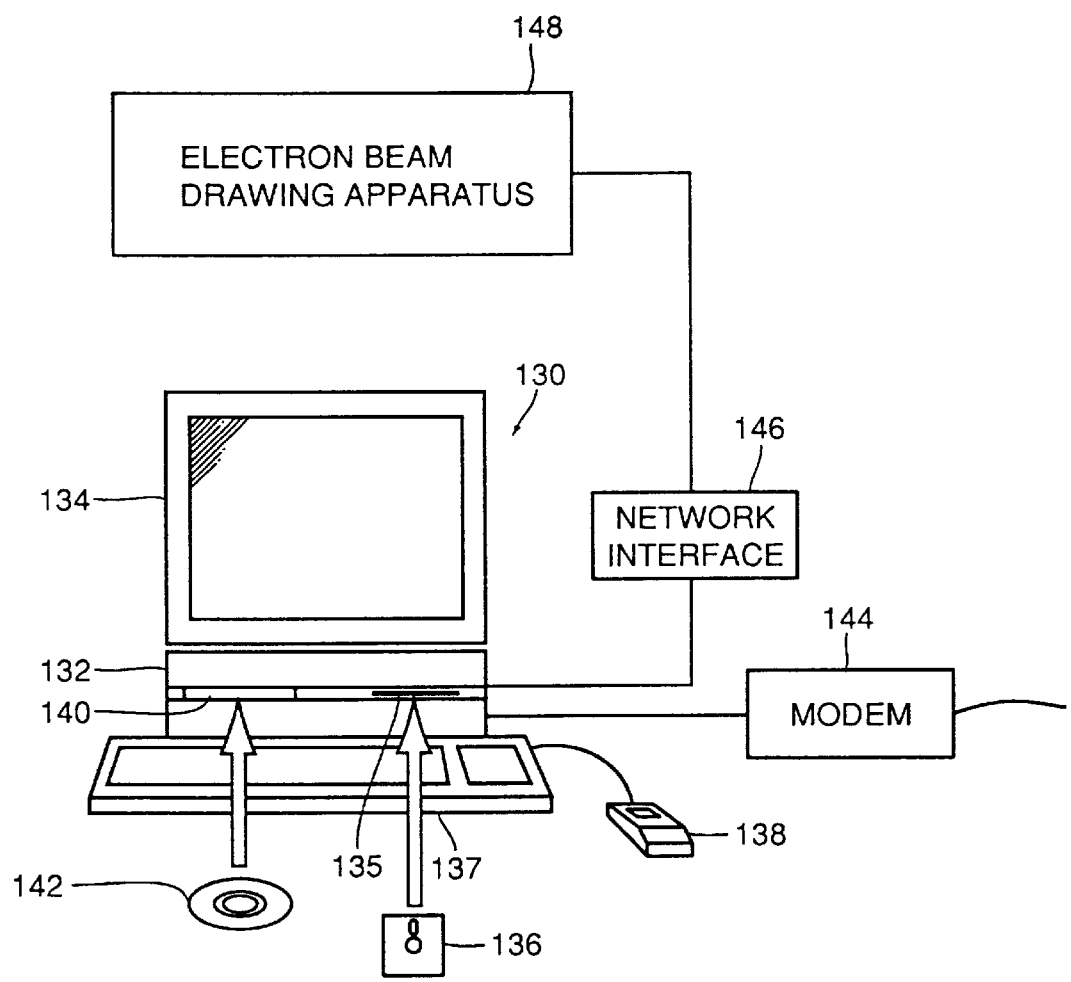
FIG. 58 is an overview showing a computer which implements the drawing data producing apparatus according to the first embodiment of the invention.
Figure 59:
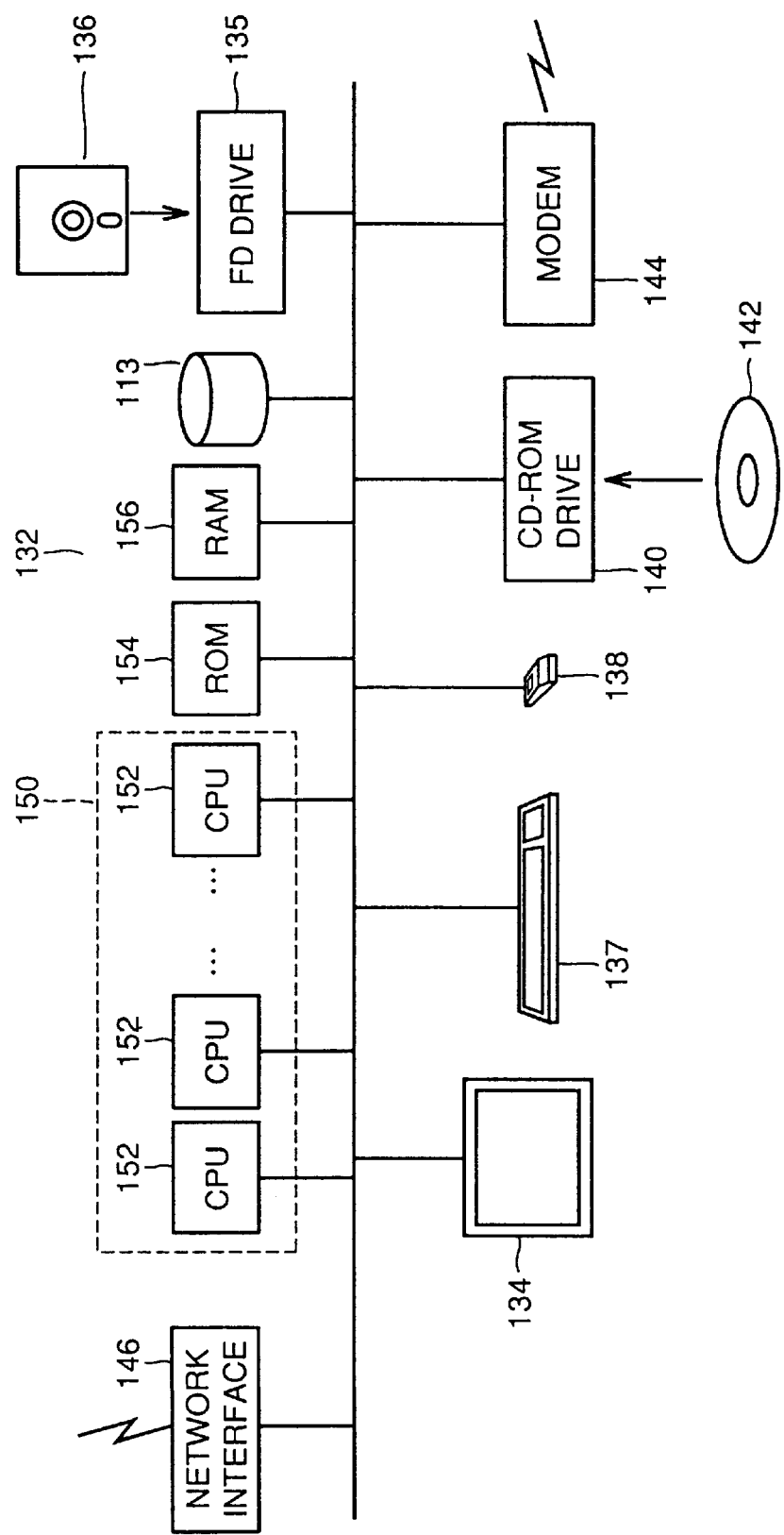
FIG. 59 is a block diagram showing a computer which implements the drawing data producing apparatus according to the first embodiment of the invention.

Referring to FIGS. 58 and 59, the charged beam drawing data producing apparatus according to the invention is substantially formed of a computer 130, and computer 130 includes a main body 132, a graphic display device 134, an FD drive 135 for a flexible disk (FD) 136, a keyboard 137, a mouse 138, a CD-ROM (Read Only Memory) drive 140 for a CD-ROM 142, a modem 144, and a network interface 146 interfacing the computer to an LAN (Local Area Network) and connecting the computer to electron beam drawing apparatus 148 through the LAN. Electron beam drawing apparatus 148 may be formed separately from or substantially integrally with computer 130.

Referring to FIG. 59 in particular, computer main body 132 includes an operation portion 150 including a plurality of (64, for example) CPUs (Central Processing Units) 152 operable in parallel, an ROM 154, an RAM (Random Access Memory) 156 shared among the plurality of CPUs 152, and a fixed disk 158. Each CPU 152 may have a local memory.

Since the operation of the computer itself is well known it will not be detailed here. Note that though there may be a single CPU, the plurality of CPUs 152 are provided according to this embodiment in order to perform processing at a high speed as the figure processing proceeds in parallel.

The charged beam drawing data producing apparatus according to the invention is implemented by making the computer execute a prescribed program for shape simulation. The shape simulation program is stored in a flexible disk 136 or a CD-ROM 142 and supplied to a user. Alternatively, the program may be transferred to the computer on the network through modem 144 or network interface 146.

The program is stored in fixed disk 158, loaded into RAM 156 and partly executed in parallel by CPUs 152. The way of controlling the program will be described later. The operator operates the apparatus by manipulating keyboard 137 and mouse 138 while looking at graphic display device 134.

Now, the functions shown in FIG. 57 will be described. Design data 100 is divided to figure processing regions by figure processing region dividing portion 102 as is with the conventional case. The data is output as a plurality of pieces of figure data 104. An example of design data before divided to figure processing regions is shown in FIG. 68, and an example of divided figure data is shown in FIG. 69.

Figure 68:
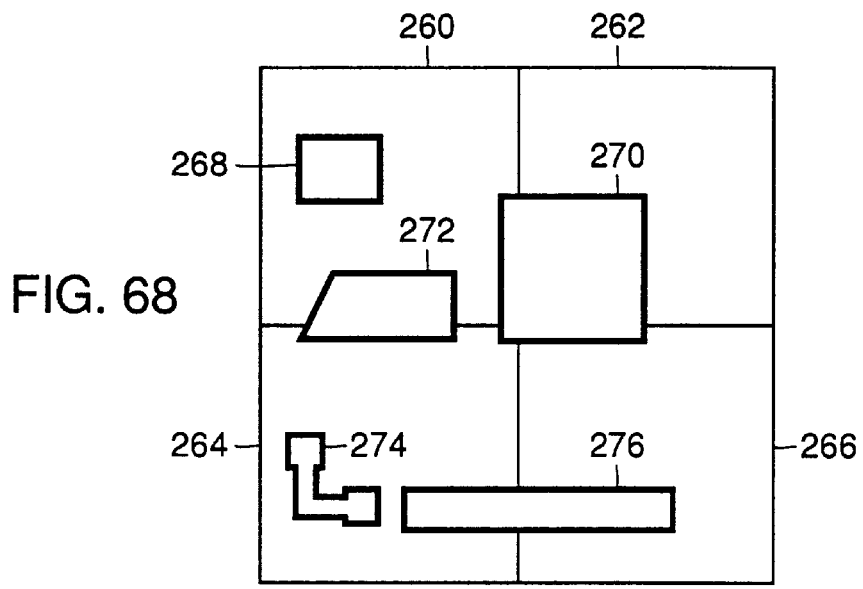
FIG. 68 is a diagram showing figures input to the drawing data producing apparatus according to the first embodiment.

Referring to FIG. 68, five figures 268, 270, 272, 274 and 276 are present in four figure processing regions 260, 262, 264 and 265. Among the figures, figure 274 when subject to a basic figure processing leaves a minute figure to draw as described above. Among the figures, figures 270, 272 and 276 are present over a number of figure processing regions.

Figure 69:
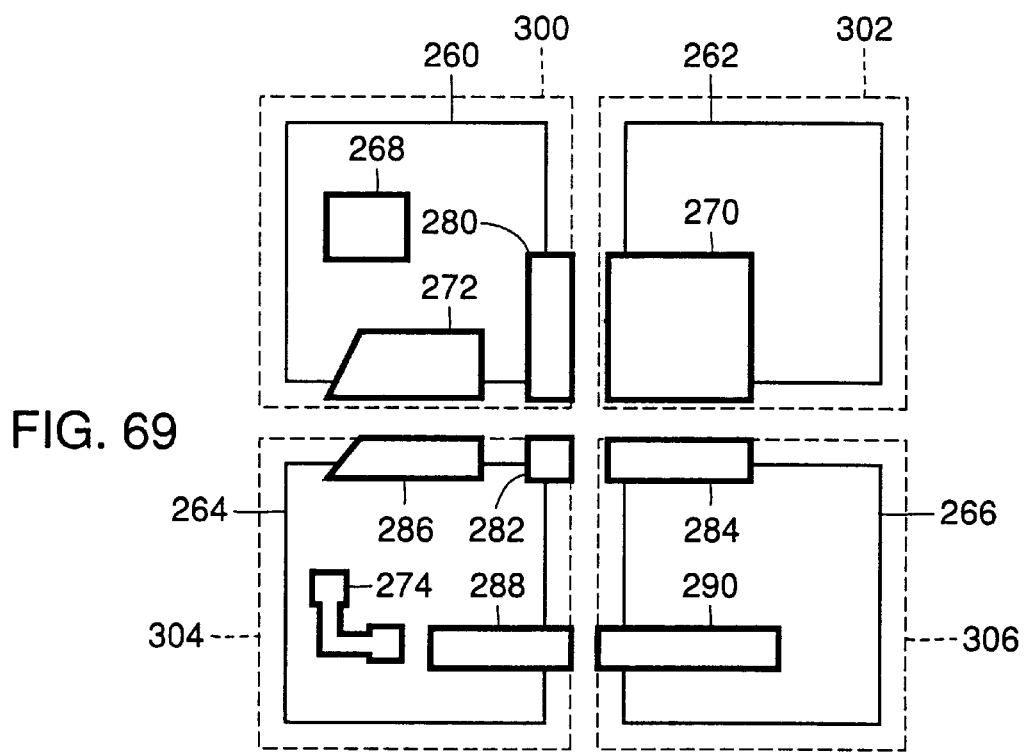
FIG. 69 is a diagram showing figures allocated to figure processing regions with redundancy regions by figure processing region dividing portion 102.

Referring to FIG. 69, as a result of dividing into figure processing regions including redundancy regions by figure processing region dividing portion 102, each figure is divided and allocated to a corresponding figure processing region as follows. Herein, figure processing regions 260, 262, 264 and 266 are attached with redundancy regions 300, 302, 304 and 306, respectively.

Figure 272 shown in FIG. 68 is allocated to both figure processing regions 260 and 264. In this case, since the lower end of figure 272 is within the redundancy region of figure processing region 260, figure 272 in its complete form is allocated to figure processing region 260. In figure 272, figure 286, the portion below the boundary of redundancy region 304 of figure processing region 264 is allocated to figure processing region 264. More specifically, in this allocating processing, only the data of figure 286 is allocated to both figure processing regions 260 and 264.

Figure 270 shown in FIG. 68 is similarly allocated to figure processing regions 260, 262, 264 and 266 as figures 280, 270, 282 and 284. Figure 276 is allocated to figure processing regions 264 and 266 as Figures 288 and 290.

Figure 38:
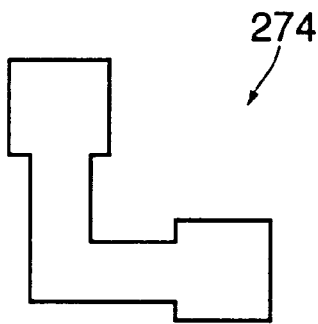
FIGS. 38 to 40 are diagrams illustrating how a minute figure to draw is generated during a basic figure dividing processing.
Figure 39:
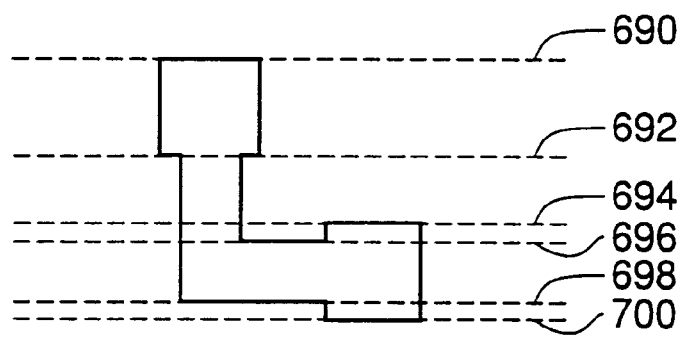
Figure 40:
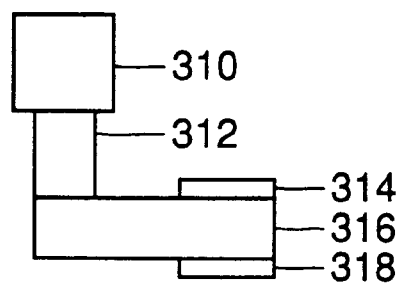
Figure 41:
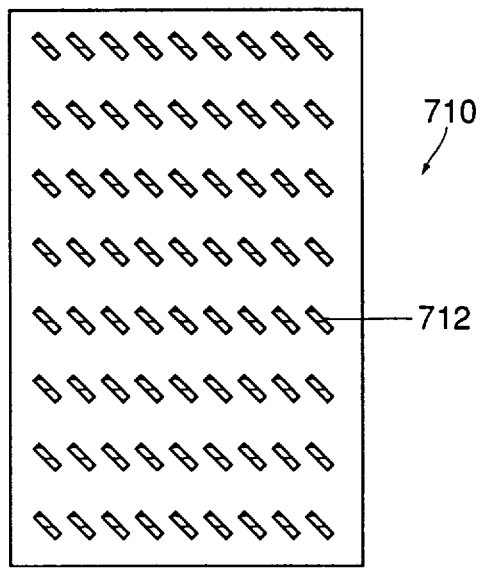
FIG. 41 shows an example of a layout pattern.
Figure 42:
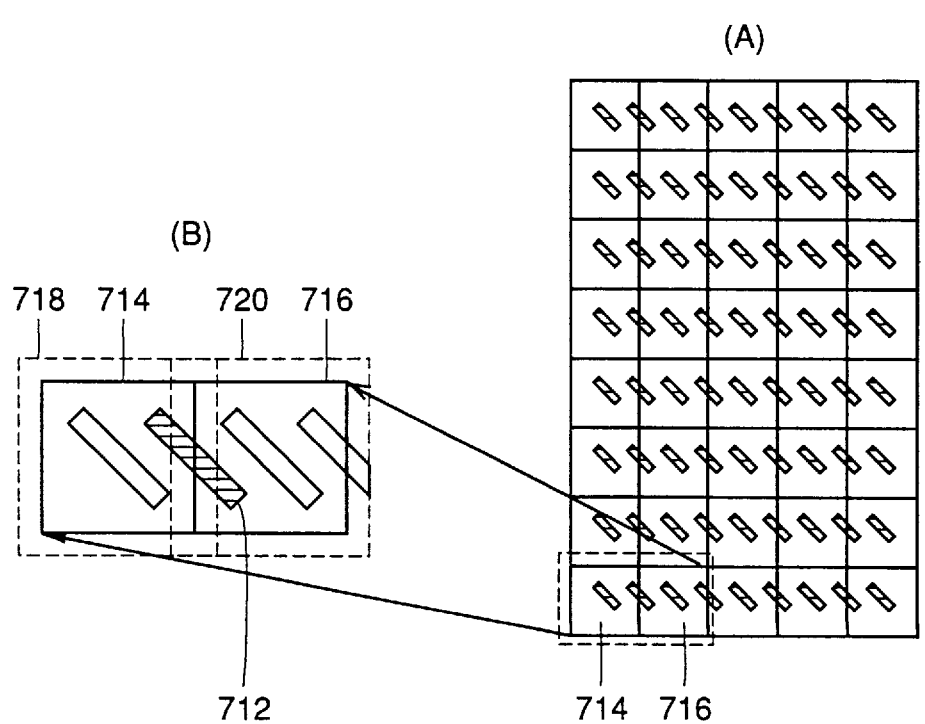
FIGS. 42 to 50 are diagrams illustrating the procedure of drawing data producing processing by a conventional electron beam drawing data producing apparatus.
Figure 43:
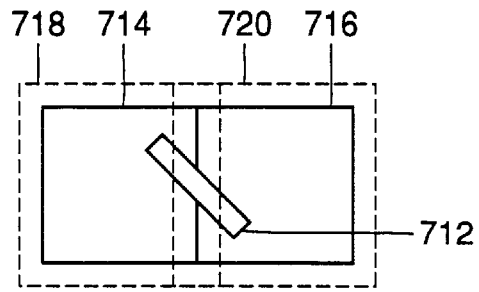
Figure 44:
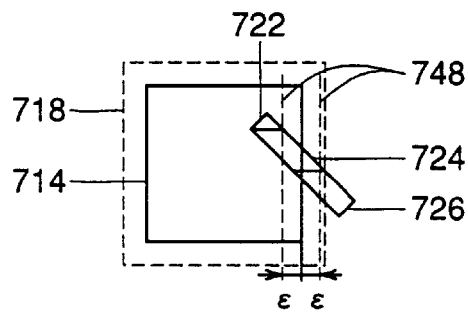
Figure 45:
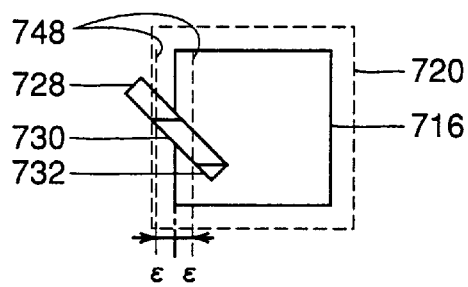
Figure 46:
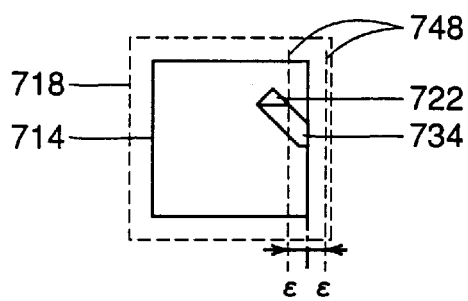
Figure 47:
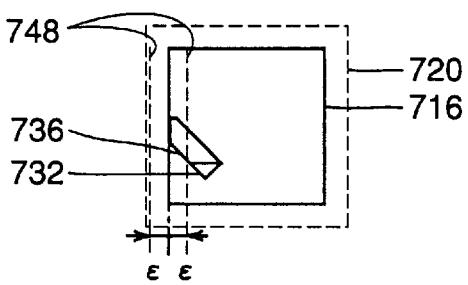
Figure 48:
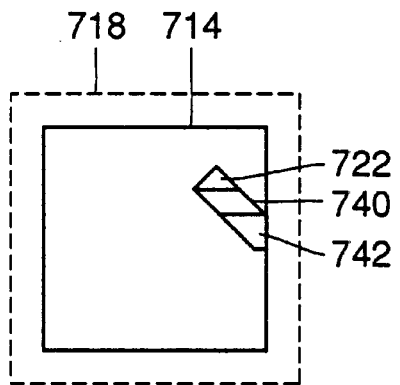
Figure 49:
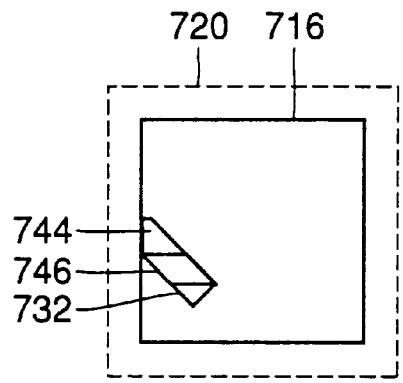

Then, basic figure processing portion 106 performs a basic figure processing to figure data 104. As described above, the basic figure processing includes dividing a figure into basic figures, removing overlapped figure portions associated with the dividing, and black-white reversing processing. Note that the optimum basic figure dividing disclosed by Japanese Patent Laying-Open No. 7-105765 by the applicant may be employed for the basic figure dividing as described above. During the basic figure dividing, a minute figure to draw may be generated as shown in FIGS. 38 to 40.

Minute figure restoring portion 108 performs a processing of restoring a minute figure to draw as will be described later to thus obtained basic figure data. During the processing of restoring a minute figure to draw, a minute figure to draw generated during basic figure processing is searched and found, the minute figure to draw is integrated with an adjacent figure into a larger figure, followed by a basic figure dividing of the larger figure.

A redundancy region included in basic figure data 110 obtained by the restoring processing by minute-figure restoring portion 108 is removed by redundancy region removing portion 112. At the time, the figure incorporating processing as has been practiced conventionally is not performed, and all the figures on a boundary of a figure processing region is divided by the boundary.

Then, the basic figure data removed of the redundancy region is merged by figure data merge portion 504, and basic figure data 116 corresponding to the entire design data 100 is output. Minute figure restoring portion 118 in the vicinity of the boundary of the figure processing region restores basic figure data 116 by searching and finding the minute figure to draw in the vicinity of the boundary of the figure processing region according to a method as will be described below, and thus restored basic figure data is allocated to drawing fields by allocating portion 120. During the allocating, a trapezoid having an inclined side is divided in a manner not to generate any minute figure to draw. The method will be described later. Thus obtained figure data allocated to the drawing fields is further formatted by electron beam drawing data format portion 122 into a data format to be handled by electron beam drawing apparatus 148, and output as electron beam drawing data 124. Electron beam drawing data 124 is sent to electron beam drawing apparatus 146 through network interface 148 shown in FIG. 58, and a pattern drawing by an electron beam is performed.

Figure 60:
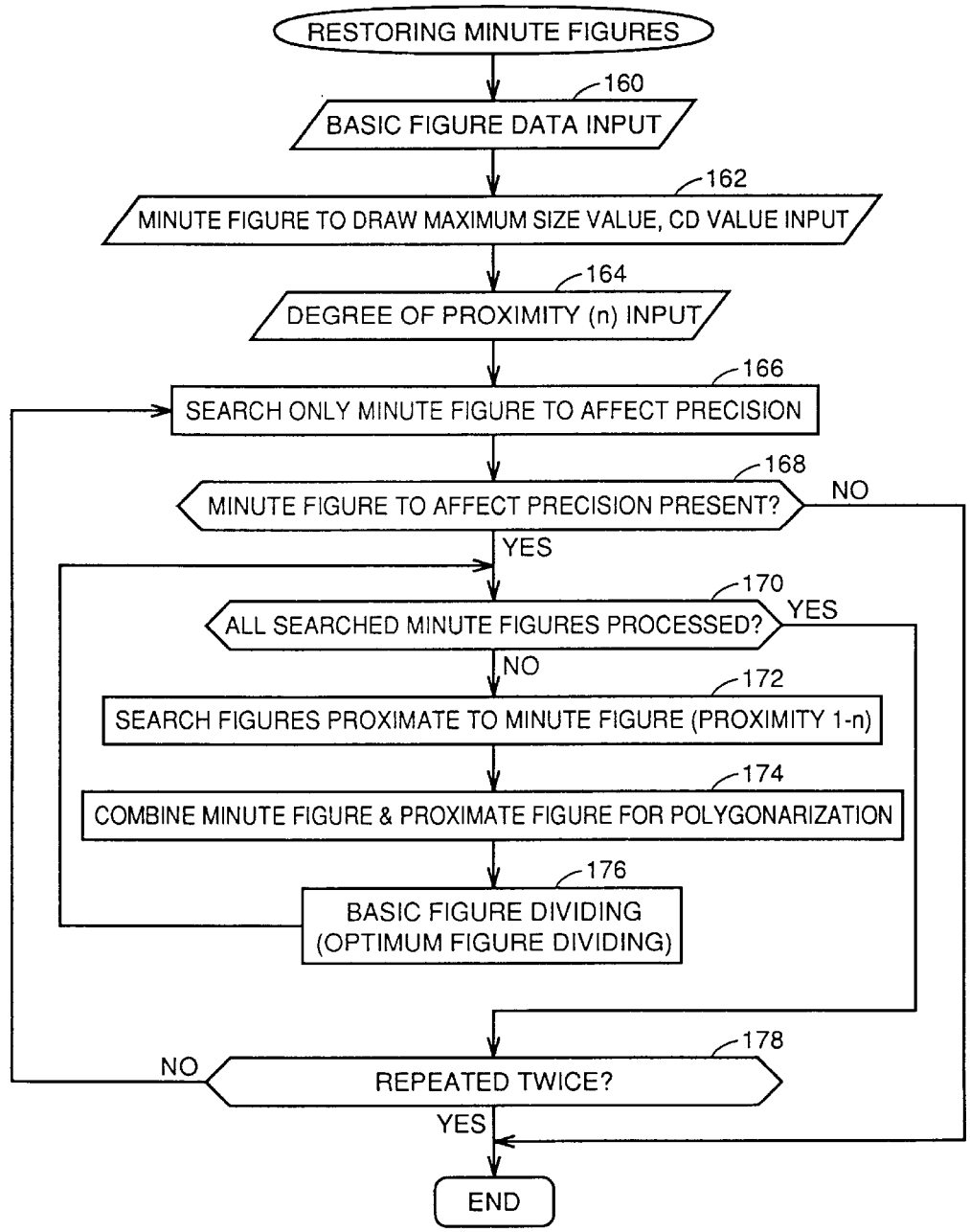
FIG. 60 is a flow chart for use in illustration of the processing by a minute figure restoring portion 108.

FIG. 60 is a flow chart for use in illustration of a program to implement minute figure restoring portion 108 shown in FIG. 57. Referring to FIG. 60, minute figure restoring portion 108 receives basic figure data output from a corresponding basic figure processing portion 106 (160). Then in step 162, the maximum size value for minute figure $\epsilon$ and the CD (Critical Dimension) value of a critical size portion are input. The CD value is a minimum size a figure should have in order to prevent pattern size degradation. During basic figure dividing, a figure is not divided into a size smaller than the CD value so that pattern size degradation can be prevented.

Then, in step 164, the operator inputs a degree of proximity m. The degree of proximity could be a value representing directness, in other words how direct a figure is in contact with another figure. The degree of proximity is used as a reference to determine up to which degree a figure should be in contact with a minute figure of interest to be integrated with the minute figure to draw into a polygon in minute figure restoring portions 108 and 118. Note however that the value input here is used only by minute figure restoring portion 108.

The degree of proximity can be further specified as follows. Assume that the degree of proximity of a figure directly in contact with a minute figure to draw is 1. Among figures in contact with a figure of a degree of proximity n, the degree of proximity for figures excluding those having a degree of proximity not more than n is defined as n+1. At the time, a figure in point-contact with the minute figure to draw only at a vertex is excluded. A figure having a degree of proximity n to the minute figure to draw is defined as the n-th proximate figure to the original minute figure to draw. The degree of proximity is used in a succeeding processing. In "input of the degree of proximity m", the degree of proximity m may be set in the range from 2 to infinity. If the degree of proximity m for figures to be grouped is set large, the number of dividing lines selected to divide a polygon increases, and therefore the probability of removing a minute figure to draw increases. This means that minute figures to draw can be more surely removed, while the processing load in searching a proximate figure, grouping, polygonalizing, and basic figure dividing increase. The processing load can be adjusted by appropriately setting the value of m. However, for m=2, the processing load is smaller than the case of m>2, while the same effect can be obtained, and therefore the degree of proximity may be fixed as m=2 without being input.

Then in step 166, the processing of searching only a minute figure affecting the precision is performed. Some minute figures to draw obtained as a result of a basic figure processing only insignificantly affect the precision of pattern size even if they are not removed. If all such figures are included in the following processing, the processing load increases, and therefore only minute figures to draw which affect on the precision are searched and subjected to the following processing. Note that the same pattern size precision may be eventually obtained if all the minute figures to draw are searched and processed rather than searching only minute figures which affect the precision for processing, but in that case, the load of processing increases.

Minute figures to draw affecting and not affecting the size precision will be described in conjunction with FIGS. 61 to 63. Whether to remove a minute figure to draw depends on whether a side degrading the size precision among the sides of the figure is not shared by surrounding figures but exposed.

Figure 61:
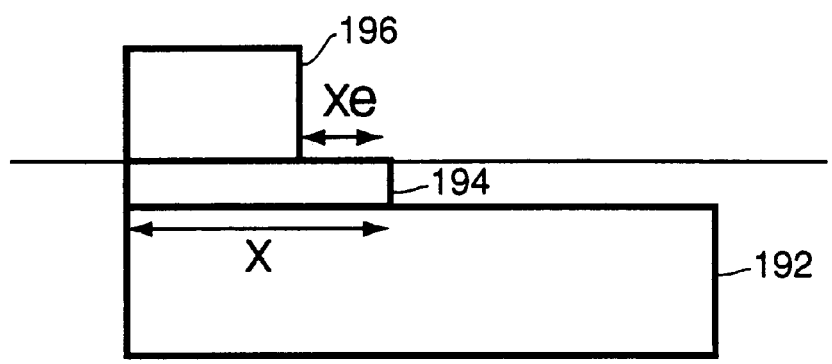
FIGS. 61 and 62 are diagrams for use in illustration of how a minute figure to draw generated by segmenting a figure by a boundary of a figure processing region affects a result of drawing.

Referring to FIG. 61, let us assume that a minute figure 194 is between two figures 192 and 196 which are both not minute figures, and that a figure dividing processing is performed at the boundary between minute figure 194 and figure 196. In the example shown in FIG. 61, the length X of a longer side of minute figure 194 is larger than minute figure maximum size values. In this case, the size precision of the side for the length X of the longer side should degrade.

In the example shown in FIG. 61, however, the lower side of minute figure 194 is entirely in contact with another figure 192. Therefore, the size precision degradation will not appear in a pattern edge (a resist edge for a resist pattern) after drawing all the figures. Meanwhile, since the portion for the length Xe of the upper side of minute figure 194 extending from the lower side of figure 196 is exposed, the size precision degradation appears in the resist edge at the portion.

The latter degrades the resist pattern size precision after drawing and therefore should be removed, while the former does not adversely affect the resist pattern size precision after drawing and does not have to be removed. In FIG. 61, the side having length Xe is the side degrading the size precision. Minute figure 194 should be removed in FIG. 61. The total value of the lengths of sides of all the minute figures which degrade the size precision is called the length of minute figures to draw.

Figure 62:
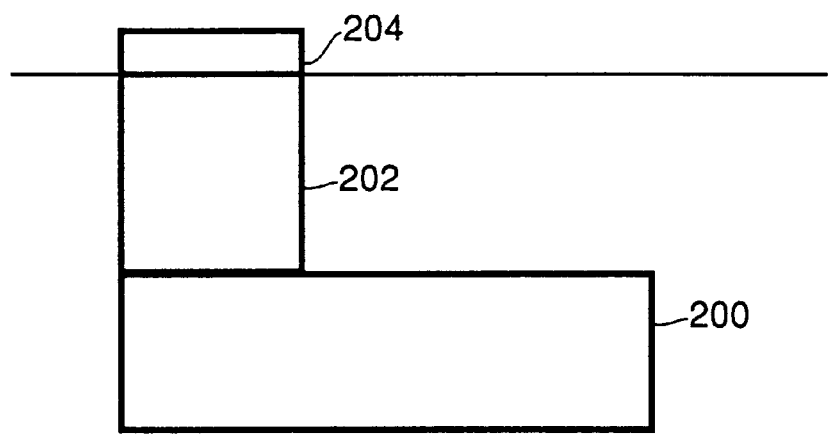
Figure 63:
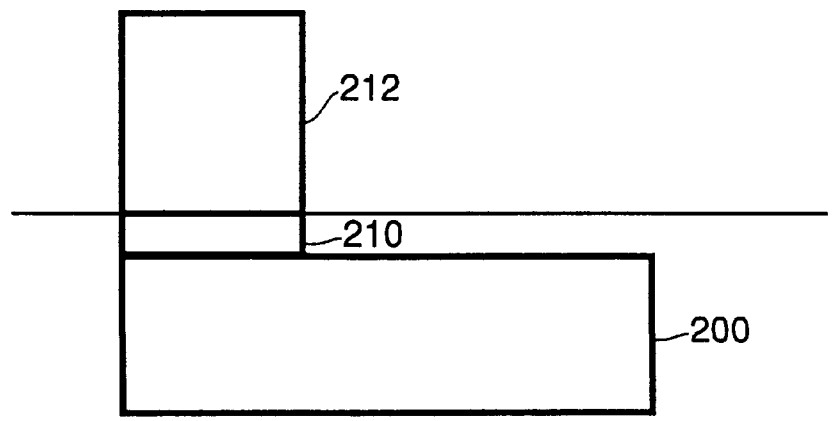
FIG. 63 is a diagram for use in illustration of how a minute figure to draw generated by segmenting a figure by a boundary of a figure processing region does not affects a result of drawing.

FIGS. 62 and 63 show the same figure segmented at different positions. In FIG. 62, a figure 202 which is not a minute figure to draw is present between figure 200 and minute figure 204. In FIG. 62, the upper side of minute figure 204 is not in contact with another figure, in other words, is exposed, which leads to the degradation of the size precision. Meanwhile, in FIG. 63, a minute figure to draw 210 is between two figures 200 and 212 which are both not minute figures to draw. Furthermore, the lower side of figure 212 and the upper and lower sides of minute figure 210 are equal in length, and the upper side of figure 200 is longer than the lower side of minute figure 210. In this case, no part of the sides of minute figure 210 will appear in resist edge, the final pattern size precision will not degrade. Since the processing of a minute figure not affecting the precision of drawing as shown in FIG. 63 is not performed, the load of processing can be reduced. Such a minute figure not affecting the drawing precision can be restored to obtain the same result, but the load of processing unpreferably increases.

Referring back to FIG. 60, in step 168, it is determined whether or not a minute figure affecting the precision and not yet processed is exist. If no such figure is present, the minute figure restoring processing completes. If there is a minute figure to draw affecting the precision, the control proceeds to step 170.

From steps 170 to 176, to all the minute figures searched and found in step 166, a figure having a degree of proximity up to n to a searched minute figure is integrated with the figure followed by a basic figure dividing.

In step 170, it is determined whether or not all the minute figures found in step 166 have been processed. If all the minute figures found have been processed, the control proceeds to step 178 out of the loop as will be described. If there is still a minute figure not processed, the control proceeds to step 172, and all the figures having a degree of proximity from 1 to n in proximity with respect to the minute figure of interest are searched. Thus searched proximate figures are combined with the minute figure of interest in step 174 into a polygon. Thus obtained polygon is once again divided into basic figures in step 176. In the dividing, the optimum basic figure dividing method as disclosed by the applicant in Japanese Patent Laying-Open No. 7-105765 may be employed.

At the time, a basic figure dividing algorithm which avoids generation of a basic figure having a size smaller than an input CD value as much as possible. A figure having a width corresponding to the input CD value is prevented from being further divided by a boundary of a figure processing region. In this embodiment, by reducing the generation of a minute figure at a boundary of a figure processing region and the division of the CD portion, the drawing pattern size precision may be improved. After step 176, the control returns to step 170.

The processing from steps 170 to 176 completes to all the minute figures searched and found in step 166, the control proceeds to step 178. In step 178, it is determined if the processing from steps 170 to 176 has been performed twice. The processing may be repeated three times or more, but twice is adequate in practice as will be described later. Alternatively, the number may be designated at the time of performing the processing. If the processing has not been performed twice, the control returns to step 166, and the processing from steps 166 to 176 is repeated. When the processing from steps 166 to 176 has been performed twice, the minute figure restoring processing completes.

In FIGS. 64 to 67, an example of the processing performed in steps 170 to 176 is shown. A figure having a degree of proximity of 2 or more is included in the range of polygonalization, minute figures to draw can be more readily reduced than the method of grouping only figures directly in contact with the minute figure.

Figure 64:
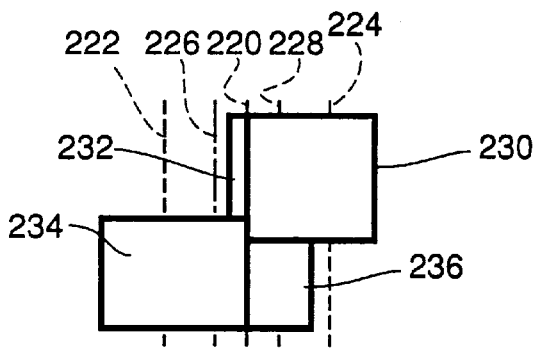
FIG. 64 is a diagram showing figures input when grouping a minute figure to draw and proximate figures.

Referring to FIG. 64, figure data including four figures 230, 232, 234 and 236 is provided. These figures and figure processing region boundary 220, a pair of figure processing region redundancy portion boundaries 222 and 224 with figure processing region boundary 220 inbetween are placed in the relation as shown in FIG. 64.

A set of points spaced apart from the figure processing boundary by the amount of minute figure to draw maximum size value $\epsilon$ are represented by dotted lines 226 and 228. The input figures include a minute figure 232, and the other figures 230, 234 and 236 are not minute figures to draw. To minute figure 232, figures 230 and 234 are both the first proximate figures. Figure 236 is the second proximate figure.

Figure 65:
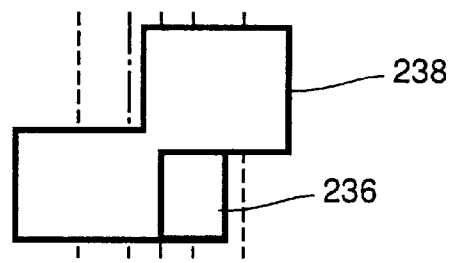
FIG. 65 is a diagram showing a figure formed by grouping the minute figure to a first proximate figure.

Now, the first proximate figure directly in contact with the minute figure to draw is searched. Figures to be searched are figures 230 and 234. Referring to FIG. 65, the figures searched and the minute figure to draw are grouped and subjected to a contour processing into a single polygon 238.

Figure 66:
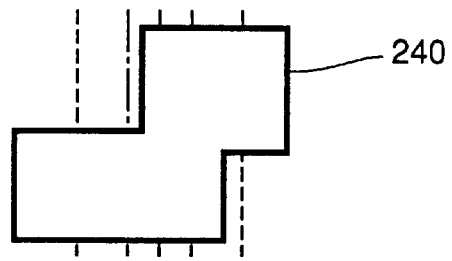
FIG. 66 is a diagram showing a figure during the process of grouping the minute figure to a second proximate figure.

Then, the second proximate figure from the minute figure to draw is searched. The figure to be searched is figure 236. Referring to FIG. 66, polygon 238 and figure 236 are grouped and subjected to a contour processing into a single polygon 240.

Figure 67:
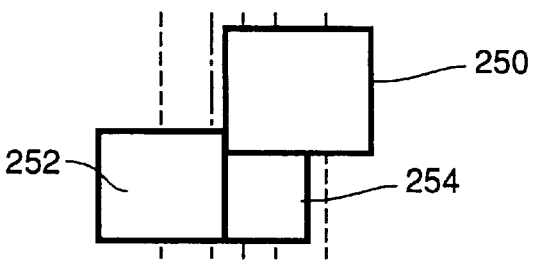
FIG. 67 is a diagram showing a grouped figure after basic figure processing.

Now referring to FIG. 67, polygon 240 is divided into basic figures. Thus obtained basic figures 250, 252 and 254 do not include any minute figure to draw. And the eventual pattern precision is improved. Thereafter, individual figures resulting from the dividing are allocated to corresponding figure processing regions. As a result of allocating, figure 252 is allocated to the figure processing region on the left side, and figures 250 and 254 to the figure processing region on the right.

Figure 70:
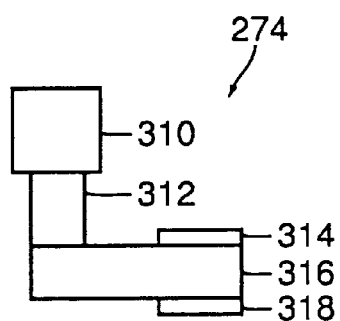
FIG. 70 is diagram showing a figure with a minute figure to draw resulting from a basic figure processing.

FIGS. 70 to 73 show how basic figure dividing of figure 274 as described is improved. Referring to FIG. 70, figure 274 is divided into figures 310, 312, 314, 316 and 318 including minute figures 314 and 318 by a basic figure processing. Among these figures, from minute figure 314, the first proximate figure is figure 316, and the second proximate figure is each of figures 312 and 318.

Figure 71:
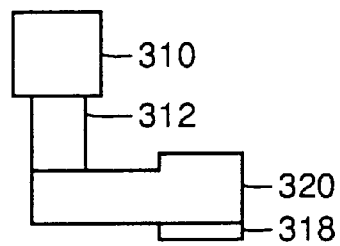
FIG. 71 is a diagram showing a figure produced by integrating the minute figure to draw with a first proximate figure shown in FIG. 70.
Figure 72:
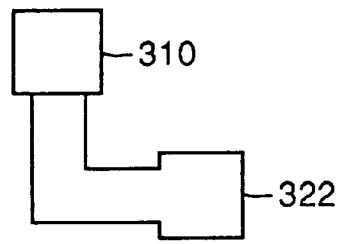
FIG. 72 is a diagram showing a figure produced by integrating the minute figure to draw with a second proximate figure shown in FIG. 70.
Figure 73:
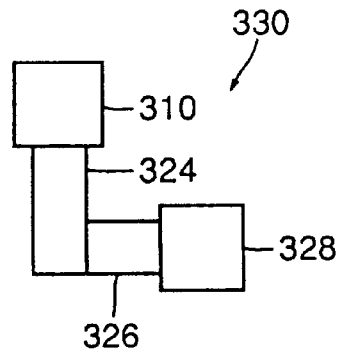
FIG. 73 is a diagram showing a figure produced by dividing the figure shown in FIG. 71 into basic figures.

Referring to FIG. 71, the first proximate figure, figure 316 and minute figure to draw 314 are integrated into a polygon 320. Then, polygon 320 and the second proximate figures, figures 312 and 318 are integrated into a polygon, 322 as shown in FIG. 72. Polygon 322 is optimally divided into basic figures to obtain figure 330 divided into figures 310, 324, 326 and 328 as shown in FIG. 73. None of these figures 310, 324, 326 and 328 is a minute figure to draw.

In this embodiment, the degree of proximity is set larger than 1, the generation of a minute figure to draw and the dividing at CD portion are reduced, and therefore the drawing pattern size precision improves.

Basic figure data 110 processed as described above by minute figure restoring portion 108 shown in FIG. 57 is applied to redundancy region removing portion 112. Redundancy region removing portion 112 segments all the figures by a boundary of a figure processing region without allocating the figures, unlike redundancy region removing portion 502 shown in FIG. 12. The processing corresponds to a processing for $\epsilon 0$ in the boundary processing described in conjunction with FIGS. 15 to 35.

Figure 74:
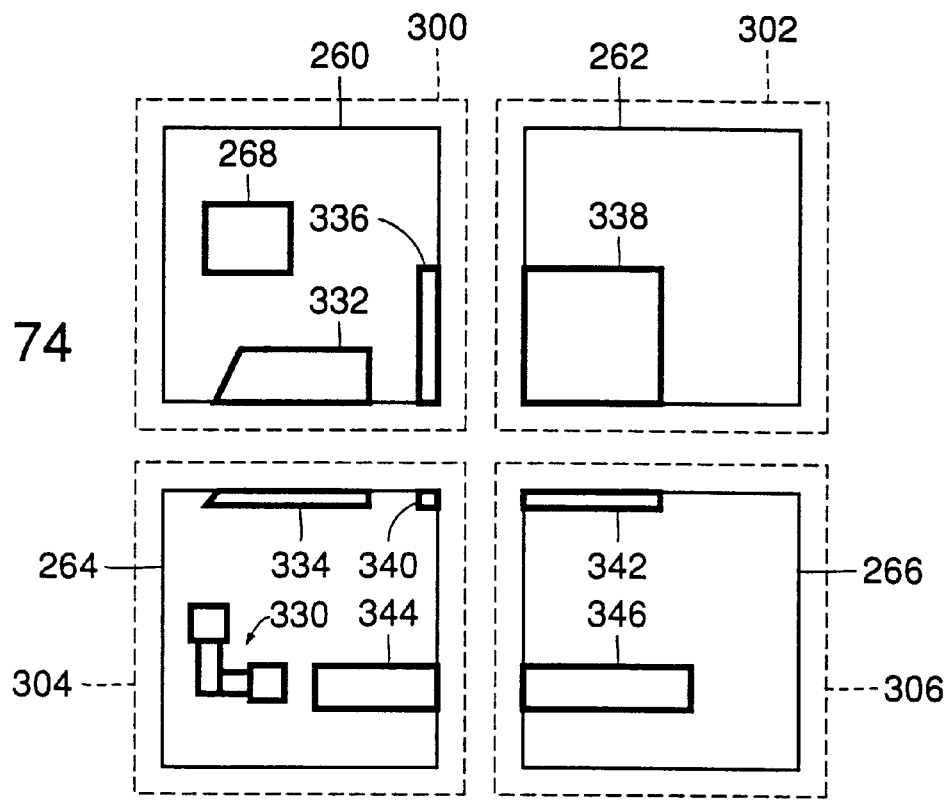
FIGS. 74 and 75 are diagrams showing in detail an example of a result of redundancy region removing processing according to the first embodiment.

FIG. 74 shows an example of a figure forcibly segmented by a boundary of a figure processing region by redundancy region removing portion 112. Referring to FIG. 74, each figure is forcibly segmented by boundaries of figure processing regions 260, 262, 264 and 266 into figures 332, 334, 336, 338, 340, 342, 344, and 346. If there were redundancy regions 300, 302, 304 and 306 around figure processing regions 260, 262, 264 and 266, no figure would be present within the redundancy regions. The needlessness of a boundary processing for allocating figures is a novel feature of redundancy region removing portion 502 according to the present invention.

Figure 75:
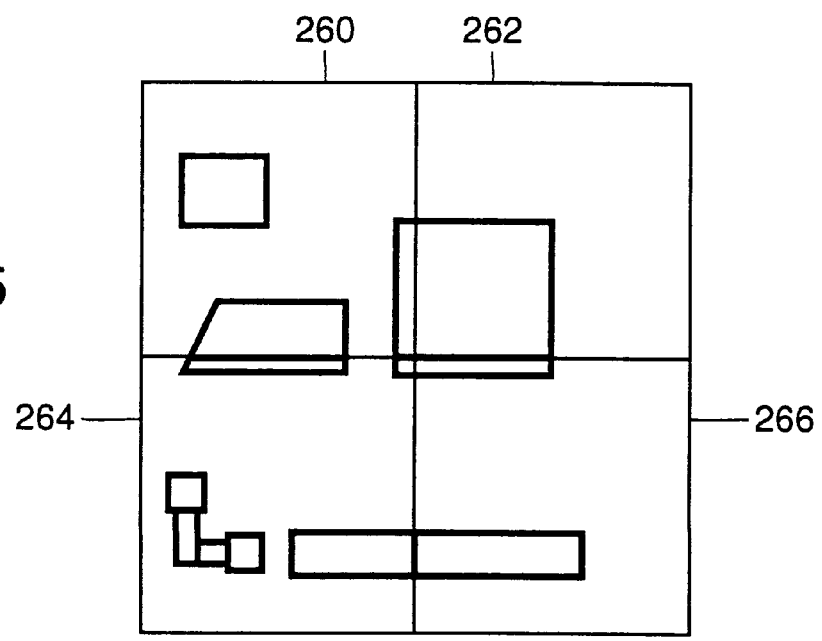

A layout represented by each figure processing region is shown in FIG. 75. As can be seen from FIGS. 74 and 75, the figures after segmentation are each included in a single figure processing region, there is no overlapping figure portion. Since each figure is forcibly segmented by figure processing regions, minute figures such as figures 334, 340, 342 are sometimes present in the vicinity of the boundaries between figure processing regions in the segmented figure. If such minute figures are generated in the vicinity of the boundary, the eventual pattern size precision can be prevented from degrading by the following processing.

Referring back to FIG. 57, figure data including figures forcibly segmented by a boundary of each figure processing region as described above is once again merged by figure data merge portion 504 into single basic figure data 116.

Minute figure restoring portion 118 in FIG. 57 restores minute figures in the vicinity of the boundaries of figure processing regions. More specifically, minute figure restoring portion 118 searches minute figures in contact with the boundaries of figure processing regions using basic figure data with no overlapping portion and forcibly segmented by redundancy region removing portion in FIG. 57, and integrates each of the searched minute figures to draw to the first proximate figure and the second proximate figure to the minute figure for restoring. Minute figure restoring portion 118 further divides thus integrated figure into basic figures and outputs basic figure data.

Figure 76:
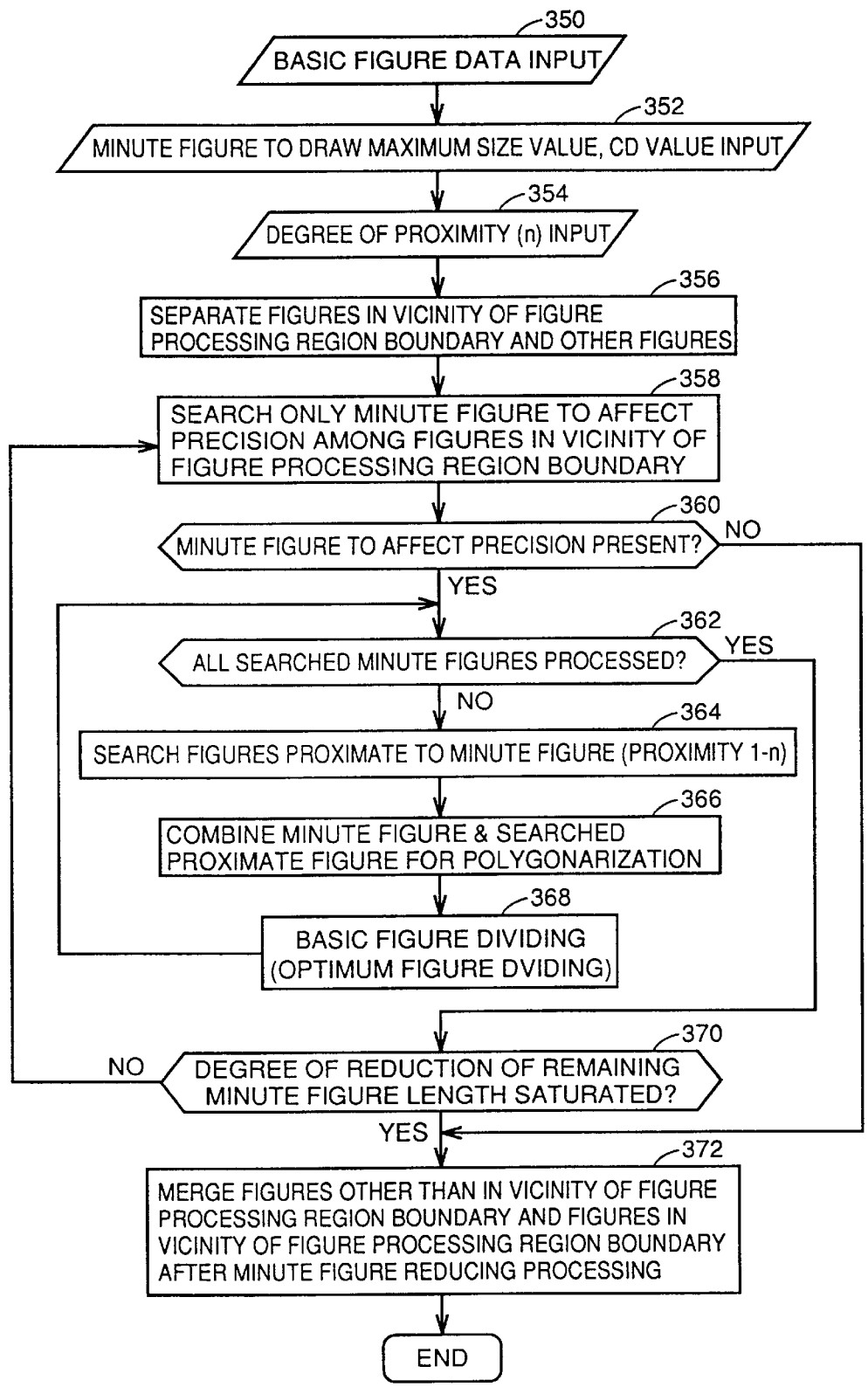
FIG. 76 is a flow chart for use in illustration of a processing by minute figure restoring portion 118 in the vicinity of the boundary of a figure processing region according to the first embodiment.

Referring to FIG. 76, the flow of processing by minute figure restoring portion 118 in FIG. 57 will be described. The processing is similar to the processing by minute figure restoring portion 108 in FIG. 57, but is different in that it is limited to figures present in the vicinity of figure processing regions. Figure data including figures produced by forcibly segmenting a figure by boundaries of figure processing regions is input (350). Then in step 352, minute figure to draw maximum size value $\epsilon$ and the CD value of the critical dimension portion are input. During dividing the figure into basic figures, the figures are not divided into a size smaller than the CD value so that the pattern size degradation is prevented.

Then, in step 354, a degree of proximity n input by the operator is received. The degree of proximity has been described in connection with minute figure restoring portion 108. The value input here is used only by minute figure restoring portion 118. In "input of degree of proximity n", the degree of proximity n can be set in the range from 2 to infinity. For n=2, the same effect for n>2 can be obtained for a smaller processing load, and therefore it is preferable to fix the degree of proximity as n=2 as is the case with minute figure restoring portion 108 without inputting the proximity.

Then in step 356, figures in the vicinity of the boundaries between the figure processing regions and the other figures are separated. The processing is different from minute figure restoring portion 108 shown in FIG. 57. The succeeding processing is performed only to minute figures to draw in the vicinity of the boundaries between the figure processing regions, and the processed figures are merged with the figures other than those in the vicinity of the boundaries of the figure processing regions.

In step 358, the processing of searching only minute figures to adversely affect the precision is performed. The processing is the same as the processing in step 166 shown in FIG. 60 except that only figures in the vicinity of the figure processing region boundaries are processed. Note that a minute figure not affecting the precision may be searched and processed similarly, but the processing load undesirably increases while the effect is not improved.

Then in step 360, it is determined whether or not a minute figure to draw affecting the precision and not yet processed is present. If there is no such figure, the control proceeds to step 372. The processing in step 372 will be described later. If there is a minute figure to draw affecting the precision is present, the control proceeds to step 362.

From steps 362 to 368, for all the minute figures searched in step 166, a minute figure of interest is integrated with a figure having a degree of proximity up to n with respect to the minute figure of interest followed by a basic figure dividing processing. The processing is the same as the processing from steps 170 to 176, except that only figures in the vicinity of the boundaries between the figure processing regions are processed. Therefore, these steps will not be detailed here.

If it is determined in step 362 that all the minute figures searched in step 358 have been processed, the control proceeds to step 370. It is determined in step 370 whether the degree of reduction of the length of minute figure to draw is saturated as a result of performing the processing from steps 362 to 368. The saturation of the degree of reduction is determined by comparing the length of minute figures to draw remaining as a result of the previous processing and the length of minute figures to draw remaining as a result of the present processing, and based on whether the length of minute figures to draw has been reduced by more than a certain degree. If the degree of reduction of the remaining length of minute figures to draw is not saturated, the control proceeds to step 358, and processing from steps 358 to 368 is repeated. If the degree of reduction of the remaining length of minute figures to draw is saturated, the control proceeds to step 372. Thus, minute figures to draw can be adequately reduced without additional processing, which enables high speed processing.

In step 372, the figures other than those in the vicinity of the boundaries between the figure processing regions which have been separated in step 356 are merged with the basic figures obtained by restoring the minute figures to draw during the processing from steps 358 to 370. Once step 372 completes, the minute figure restoring processing completes.

In the processing by minute figure restoring portion 118, figures having a degree of proximity of 2 or more are included in the range of polygonalization, more minute figures to draw can be reduced than the case of grouping only the figures directly in contact with the minute figures to draw. In this embodiment, the degree of proximity is set larger than 1, and the generation of minute figures to draw and the division at the CD portion are reduced, which enables the drawing pattern size precision to be improved.

Allocating portion 120 for drawing fields shown in FIG. 57 allocates basic figures output from minute figure restoring portion 118 to drawing fields. Note that the figure processing regions are only for the convenience of operating design data, but the drawing fields are regions which can be drawn by an electron beam drawing apparatus by the deflection of an electron beam. More specifically, the drawing field is determined by the hardwarewise restrictions of the electron beam drawing apparatus and different from the figure processing region. Basic figures should be finally allocated to drawing fields not to the figure processing regions. Allocating portion 120 for drawing fields performs such a processing.

More specifically, allocating portion 120 allocates figures included in basic figure data output from minute figure restoring portion 118 to drawing fields. Strictly speaking, the drawing field is an extended drawing field formed of a drawing field region and a redundancy region. As described above, the drawing field can be drawn only by the deflection of an electron beam, but actually has some margin, and a region surrounding a drawing field can be drawn. Such a region is treated as a redundancy region and a figure present in the redundancy region can be also output by a single deflection of an electron beam.

Figure 77:
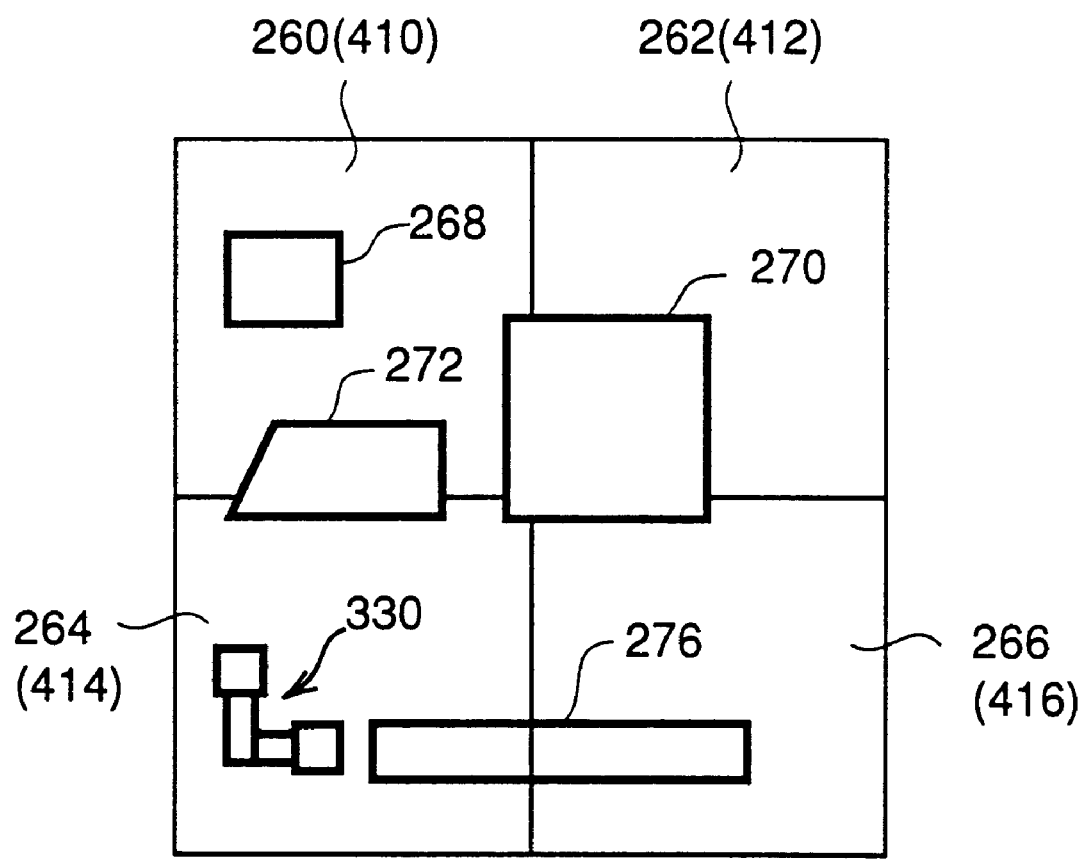
FIG. 77 is a diagram showing examples of figures input to allocating portion 120 for drawing fields according to the first embodiment.

Although the drawing field is different from the figure processing region, they are sometimes in coincidence. The processing by allocating portion 120 in such a case will be described. Let us assume that figure data input to allocating portion 120 is as shown in FIG. 77. Referring to FIG. 77, figures 268, 270, 272, 276 and 330 are present on figure processing regions 260, 262, 264 and 266. Figure 330 is a figure optimally divided into basic figures as shown in FIG. 73. In this example, since the figure processing regions and the drawing fields match, figure processing regions 260, 262, 264 and 266 match drawing fields 410, 412, 414 and 416, respectively.

The processing by allocating portion 120 for allocating basic figure data to drawing fields is basically the same as the processing of allocating figures to corresponding figure processing regions or drawing fields as has been practiced conventionally and described in conjunction with FIGS. 15 to 35, except that in allocating portion 120 according to the invention, an improved trapezoidal processing is performed. As described above, conventionally, if an inclined side of a trapezoid crosses a boundary of a figure processing region or a drawing field, a minute figure could be generated as a result of a basic figure dividing. In this embodiment such a disadvantage is overcome. The flow chart is given in FIG. 78.

Figure 36:
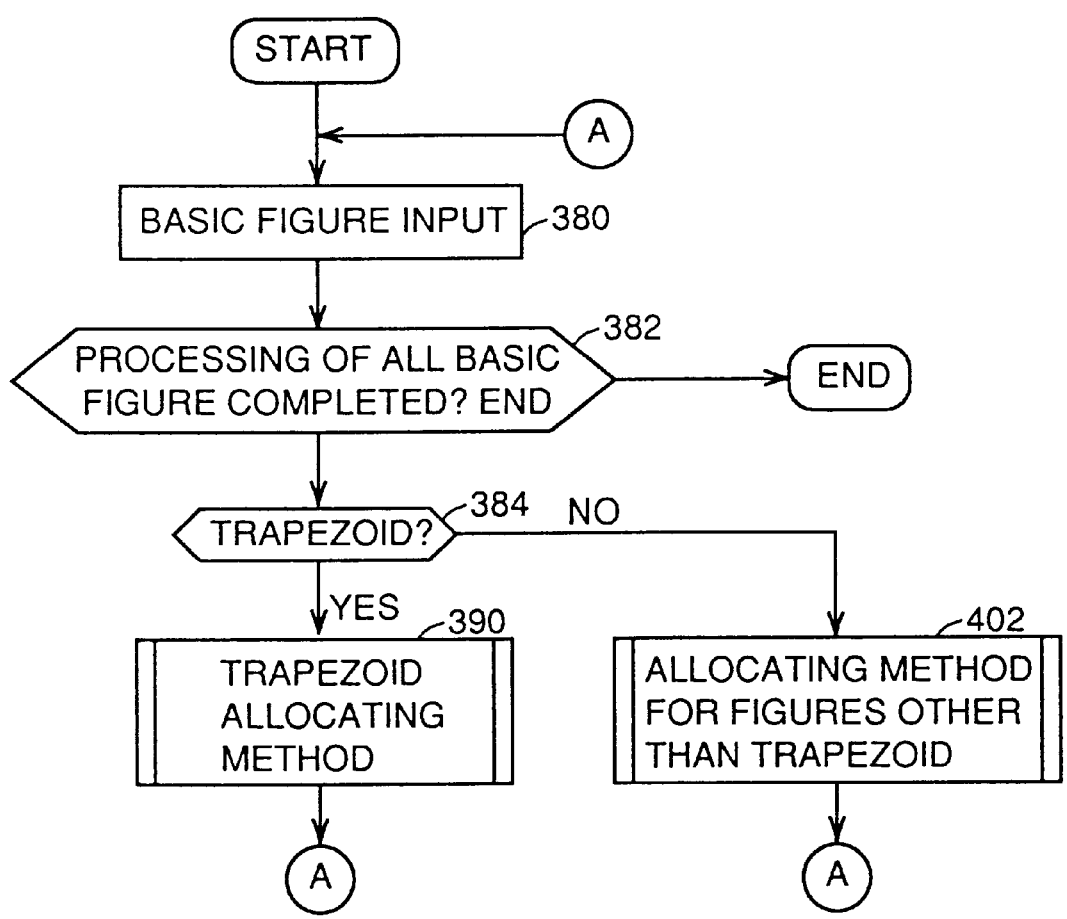
FIG. 36 is a flow chart for use in illustration of a conventional processing of allocating figures to drawing fields.
Figure 78:
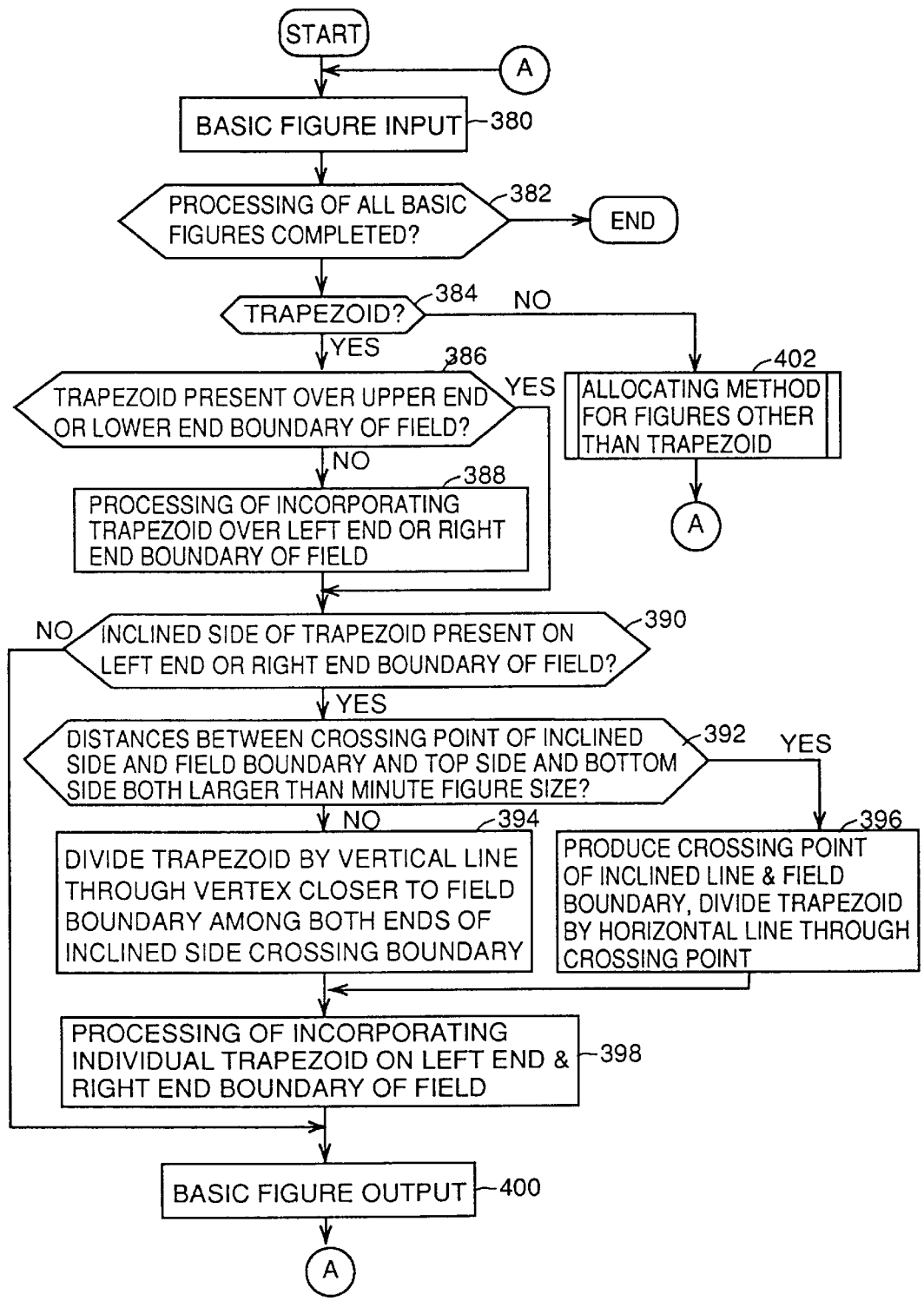
FIG. 78 is a flow chart for use in illustration of a processing executed by allocation portion 120 for drawing fields according to the first embodiment.

In FIG. 78, the same steps as those in FIG. 36 are denoted by the same reference characters, and a description thereof will not be repeated. The flow chart shown in FIG. 78 is different from that in FIG. 36 in that in place of allocating method 540 for a trapezoid shown in FIG. 36, an improved method of allocating a trapezoid including steps 386 to 400 is employed. The allocating method 540 for trapezoid shown in FIG. 36 is specifically illustrated in FIG. 37, and the same processings as those in FIG. 37 are denoted by the same reference characters in FIG. 78.

Figure 37:
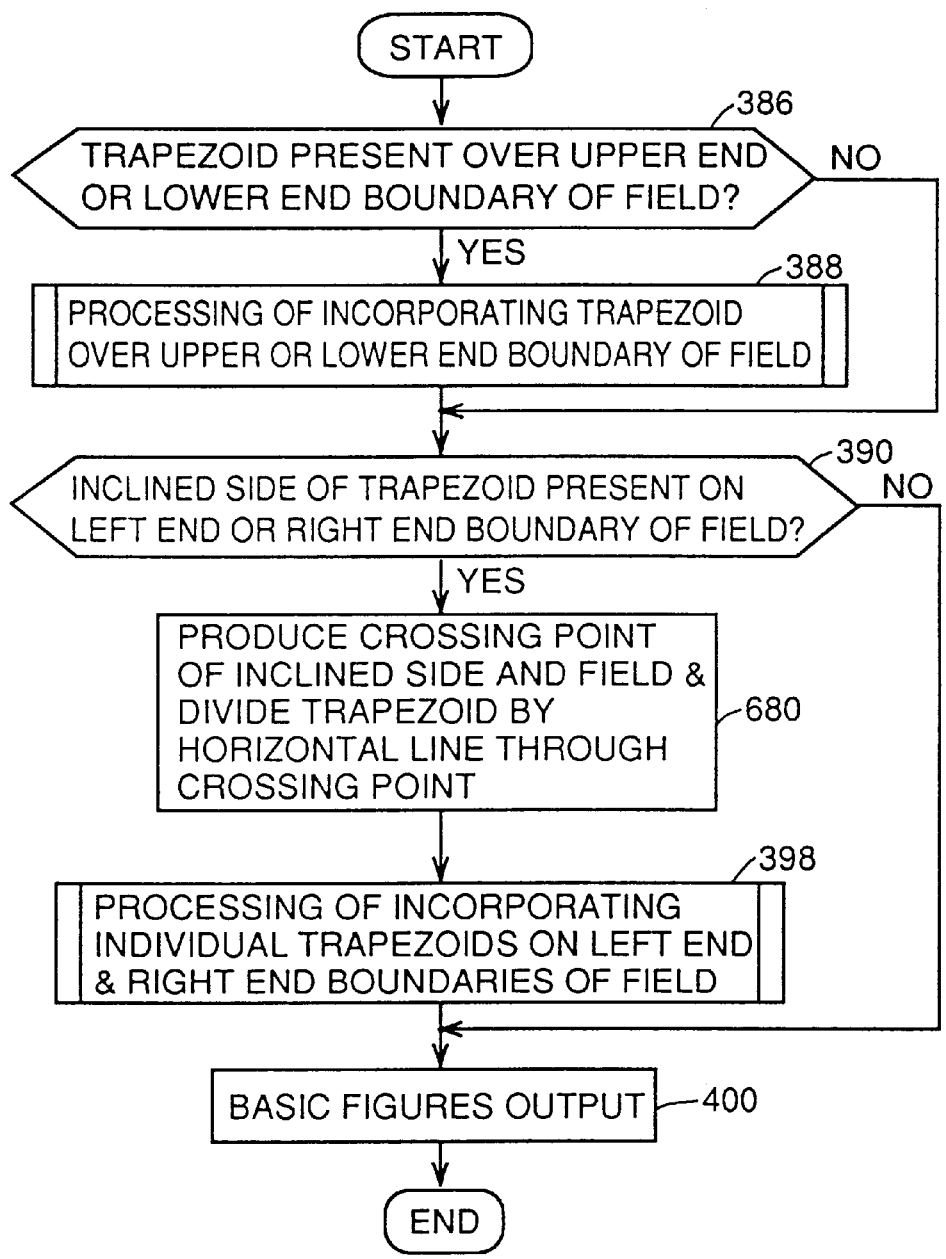
FIG. 37 is a flow chart for use in illustration of a conventional processing of allocating a trapezoid to drawing fields.

The processing from steps 386 to 400 in FIG. 78 is different from the processing in FIG. 38 in that in place of step 680 in FIG. 37, the processing from steps 392 to 396 is performed. Now, the processing performed in these steps will be described in detail. A conventional method of allocating a trapezoid having a lower base in parallel to the X-axis will be described. The same processing flow applies to a trapezoid having a lower base in parallel with the Y-axis.

It is determined whether or not the trapezoid is over the boundary of an upper end or a lower end of a drawing field (386). If the trapezoid is present at the upper end or lower end of the field, the control proceeds to step 388, and a processing of incorporating a trapezoid at the boundary of the upper end or lower end of the field is performed (388). The processing itself is the same as a normal allocating processing.

Then, it is determined whether an inclined side of the trapezoid to be processed is present over the boundary of the left end or right end of the drawing field (390). If the inclined side of the trapezoid is not present over the boundary of the left end or right end, the control proceeds to step 400, and basic figures are output, thus completing the processing. If the inclined side of the trapezoid is present over the boundary of the left end or right end, the control proceeds to step 392. It is determined in step 392 whether the distances between the crossing point of the inclined side of the trapezoid and the field boundary and upper and lower bases of the trapezoid are both larger than minute figure to draw maximum size value $\epsilon$. If they are both larger than maximum size value $\epsilon$, the control proceeds to step 396. The control otherwise proceeds to step 394.

In step 396, the crossing point of the inclined side and the field boundary is produced, and the trapezoid is divided by a horizontal line penetrating through the point. This processing is the same as the processing in step 680 in FIG. 37. Individual figures produced by the dividing are also subjected to an allocating processing at the left and right ends of the drawing field. The allocating method is also the same as the figure processing region boundary processing for a rectangle which has been described in conjunction with the conventional technique. Since the distances between the crossing point of the inclined side and the field boundary and the upper and lower bottoms are both larger than $\epsilon$, no minute figure to draw results from the dividing.

Figure 86:
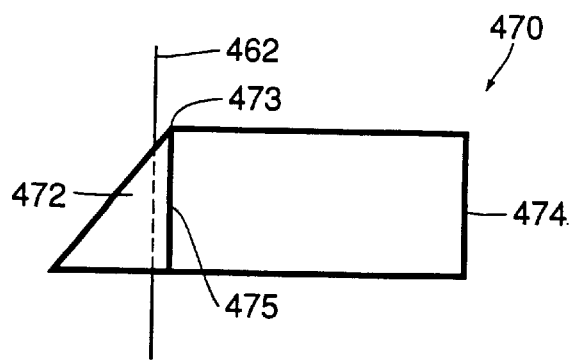
FIG. 86 is a diagram showing that if an inclined side of a trapezoid crosses a boundary, no missing portion results in the figure by a figure processing region boundary figure allocating processing according to the first embodiment.

In step 394, as shown in FIG. 86, trapezoid 470 is divided by a vertical line through a vertex closest to the boundary of the field among both ends of the inclined side of trapezoid 470 crossing the field boundary 462. Trapezoid 470 is divided into a triangle 472 including the inclined side and a rectangle 474 as a result. None of these figures are a minute figure to draw. By the dividing processing shown in FIG. 86, no minute figure to draw is generated even during dividing a trapezoid including an inclined side. The precision of fine pattern drawing size can be improved as a result.

Figure 79:
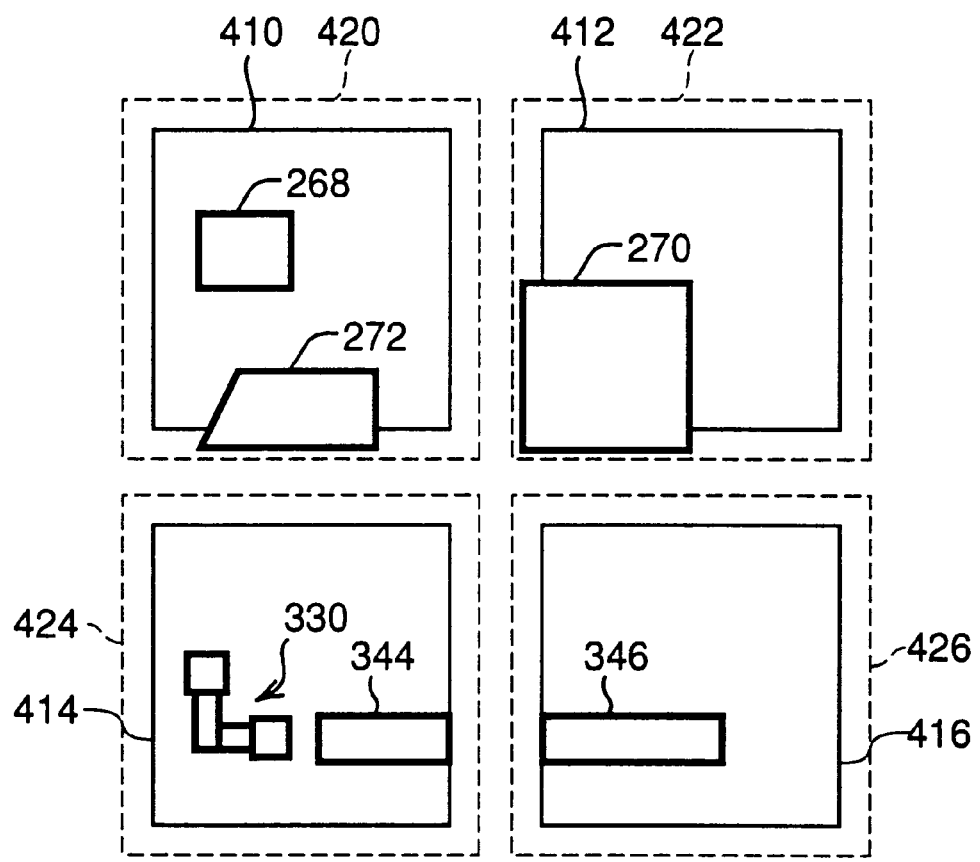
FIG. 79 is a diagram showing an example of a result of allocating the figures shown in FIG. 77 to drawing fields.

The figures shown in FIG. 77 are allocated to drawing fields 410, 412, 414 and 416 by allocating portion 120 as shown in FIG. 79. As seen from FIG. 79 in comparison with FIGS. 74 and 75, there is no minute figure to draw at the figure processing boundaries.

In FIGS. 77 and 79, the drawing field regions are in coincidence with the figure processing regions, but they are often different. A result of processing when the drawing field regions are different from the figure processing regions is shown in FIGS. 80 to 83. Referring to FIG. 80, figures 268, 270, 272, 276 and 330 formed on figure processing regions 260, 262, 264 and 266 are allocated to drawing fields 430, 432 and 434 defined by boundaries 420, 422, 424 and 426 inconsistent with the figure processing regions. The figures are allocated in the same manner as the method described in conjunction with FIG. 78, but allocated to the drawing fields not to the figure processing regions. The other drawing fields shown in FIG. 80 have no figure to be allocated in this example, and therefore will not be described below.

Figure 80:
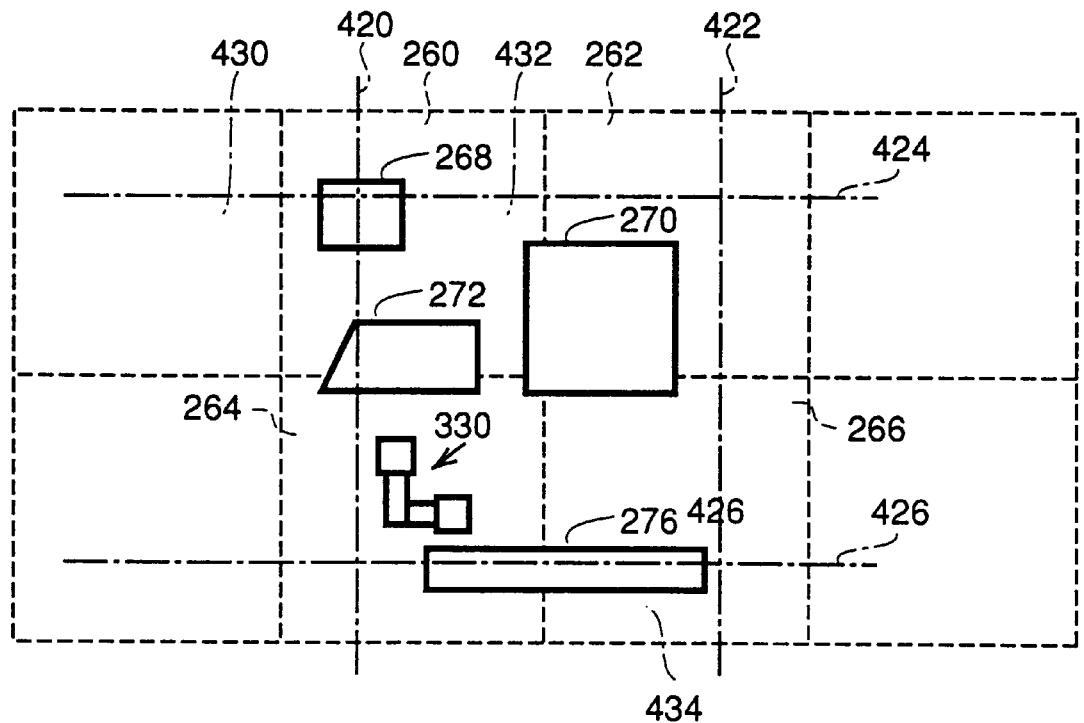
FIG. 80 is a diagram showing the relation between each figure and a corresponding drawing field when the figures shown in FIG. 77 are allocated to drawing fields not in coincidence with figure processing regions.

Referring to FIG. 80, figures 268 and 272 are present over drawing fields 430 and 432. A figure 276 is present over drawing fields 432 and 434. Figures 270 and 330 are entirely within drawing field 432. An upper portion of figure 268 extends from drawing field boundary 424 into the above drawing field only by a very short length. Similarly, an upper portion of figure 276 extends into drawing field 432 by a very short length crossing drawing field boundary 424. The short lengths are both smaller than maximum size value $\epsilon$. Meanwhile, a left end portion of figure 272 extends into drawing field 430 from drawing field 432 for the length larger than maximum size value $\epsilon$. figure 268 is present over drawing fields 430 and 432, and its portions in both fields are each larger than maximum size value $\epsilon$.

Figure 81:
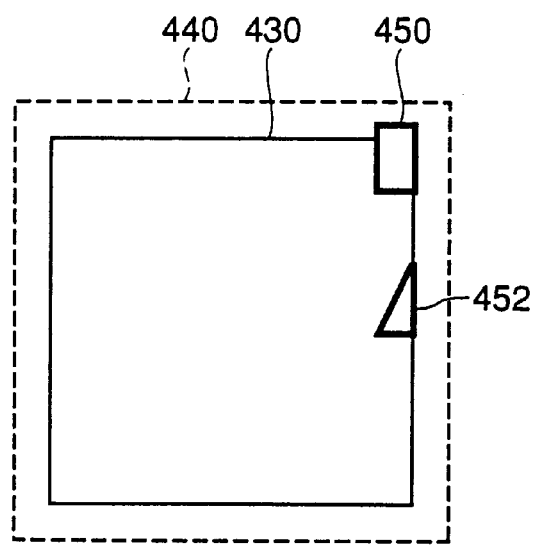
FIGS. 81 to 83 are diagrams showing an example of a result of allocating the figures shown in FIG. 77 to drawing fields not in coincidence with figure processing regions.
Figure 82:
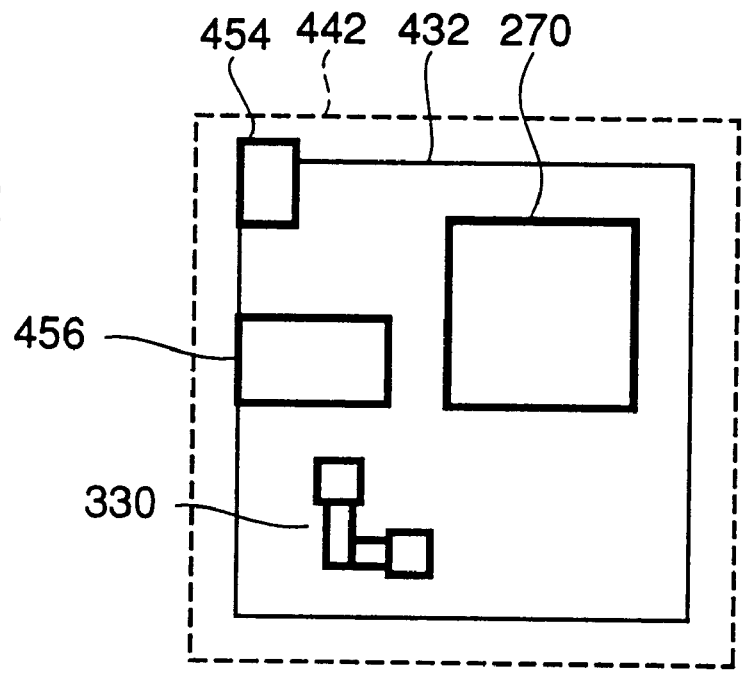
Figure 83:
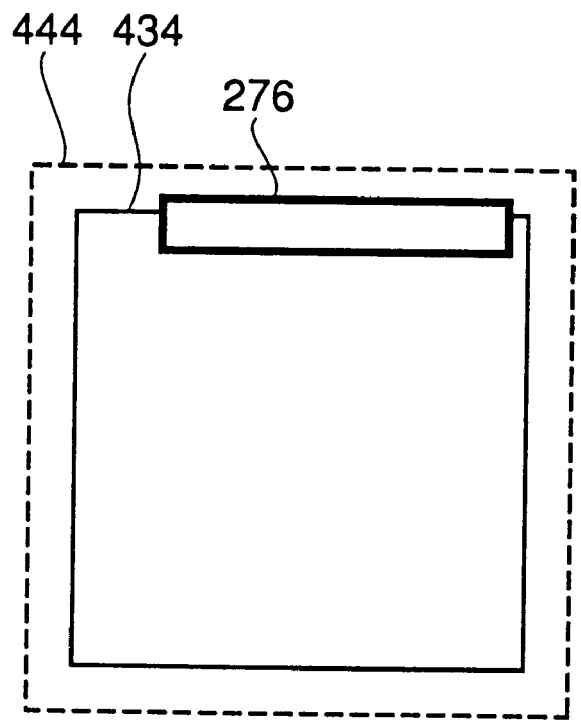

An allocating result is given in FIGS. 81 to 83. Referring to FIG. 81, to drawing field 430, the left half figure 450 of figure 268 shown in FIG. 80 and a part 452 of figure 272 on the left of drawing field boundary 420 are allocated. Figure 450 includes the portion extending into the above field by the very small length from boundary 424. The right end of figure 452 is defined by boundary 420. Referring to FIG. 82, to drawing field 432, a figure 454 for the right half of figure 268 shown in FIG. 80, a part 456 of figure 272 on the left of drawing field boundary 420, figure 270 and figure 330 are allocated. Also in this case, figure 454 includes a portion extending into the above drawing field from drawing field boundary 424. Referring to FIG. 83, drawing field 434 includes figure 276 shown in FIG. 80. The portion for the short length of figure 276 extending into drawing field 432 from boundary 426 is included in whole in figure 276.

As can be seen from FIGS. 81 to 83, when the figures present over the figure processing region boundaries and drawing field boundaries as shown in FIG. 80 are forcibly segmented by these boundaries, and placed in an arrangement possible to cause a minute figure to draw, no such minute figure to draw is eventually generated in the vicinity of a drawing field.

Basic figure data allocated to drawing fields by allocating portion 120 shown in FIG. 57 is converted into electron beam drawing data by electron beam drawing data format portion 122.

By the charged beam drawing data producing apparatus according to the first embodiment of the invention as described above, the generation of minute figures to draw can be prevented more than the conventional cases as will be described, and the eventual drawing pattern size precision can be improved. Now, how the disadvantages described in conjunction with FIGS. 51 to 54 are solved by the apparatus will be detailed.

Figure 50:
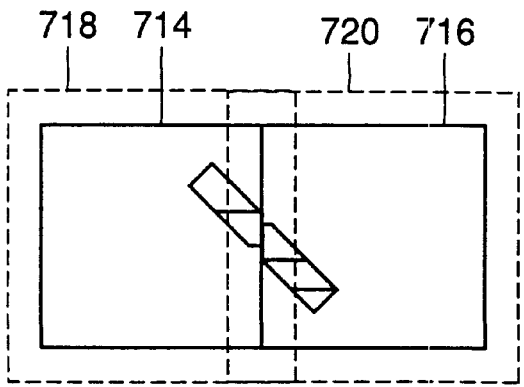
Figure 51:
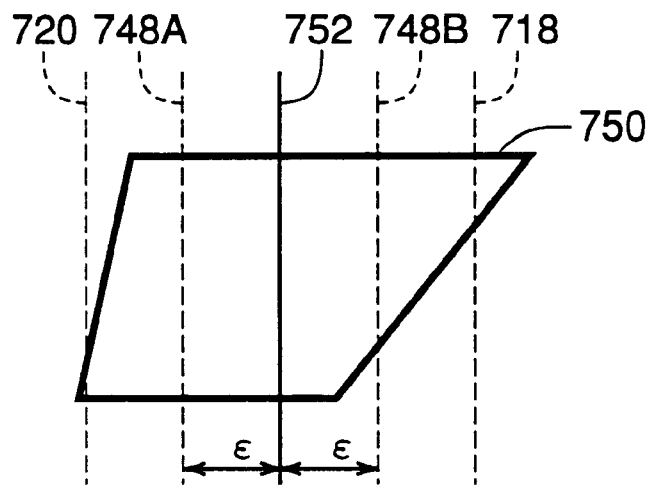
FIGS. 51 to 54 are diagrams showing in detail how missing parts are generated in figures by a conventional method of allocating figures at the boundary of a figure processing region.
Figure 52:
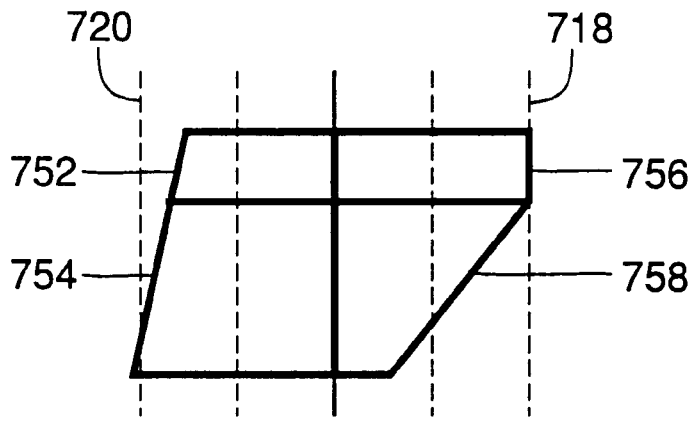
Figure 53:
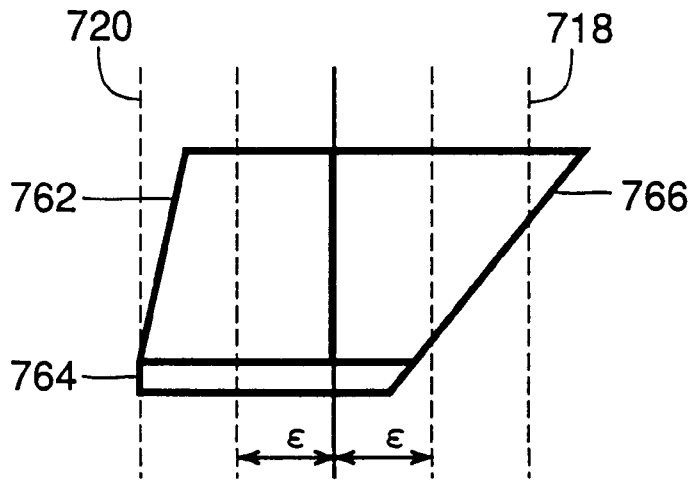
Figure 54:
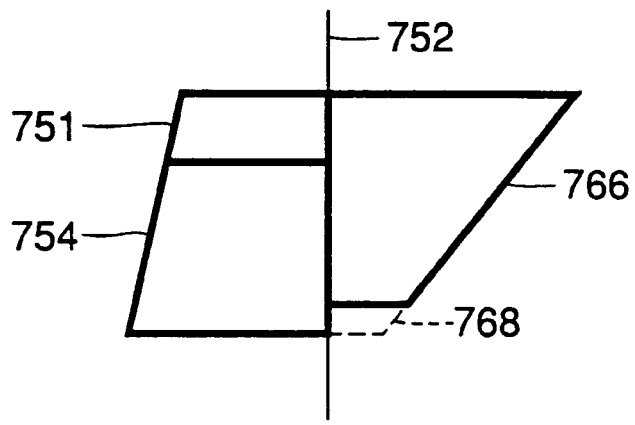
Figure 84:
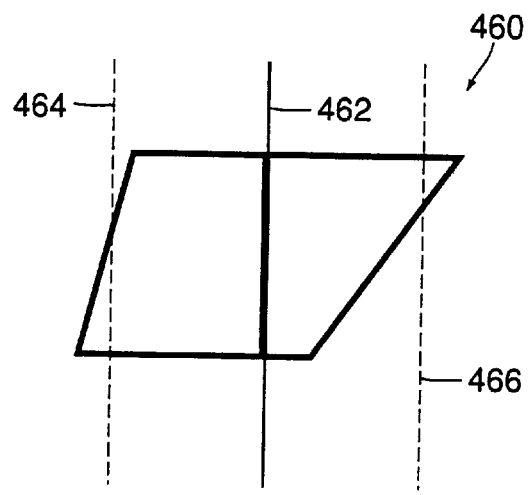
FIG. 84 is a diagram for use in illustration of the processing of segmenting a figure by a boundary of a figure processing region according to the first embodiment.
Figure 85:
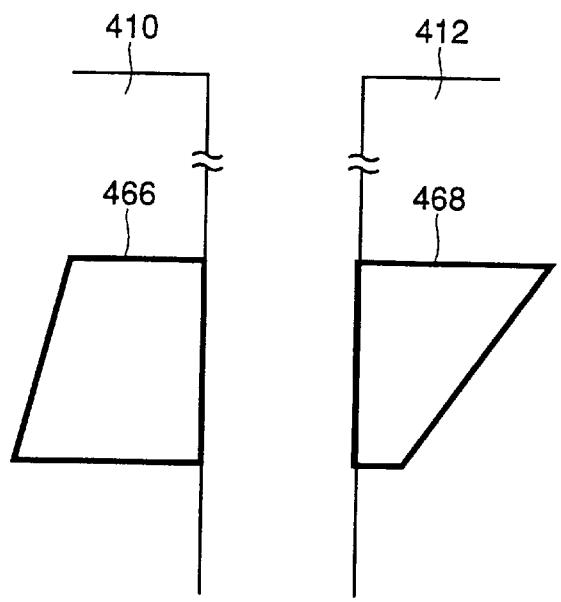
FIG. 85 is a diagram for use in illustration of the processing of segmenting a figure by a boundary of a figure processing region according to the first embodiment.

FIG. 84 shows how redundancy region removing portion 112 according to the present invention allocates the same figures as shown in FIG. 51 to two figure processing regions. In the conventional case, in view of the redundancy region boundary 464 of the figure processing region on the right side and the redundancy region boundary 460 of the figure processing region on the left side, figures within the redundancy regions of both figure processing regions are separately processed, which has generated a missing portion as shown in FIG. 54. On the other hand, the apparatus according to this embodiment forcibly segments the figures by figure processing boundary 462 irrespectively of the boundaries 464 and 466 of redundancy regions. Figure 468 for the right half is allocated to figure processing region 412 on the right side, and figure 466 for the left half to figure processing region 466 on the left side as shown in FIG. 85. As a result, no inconsistency is generated between figures on the left and right sides, and no missing portion is generated. The disadvantage shown in FIG. 50 is solved as well.

Figure 55:
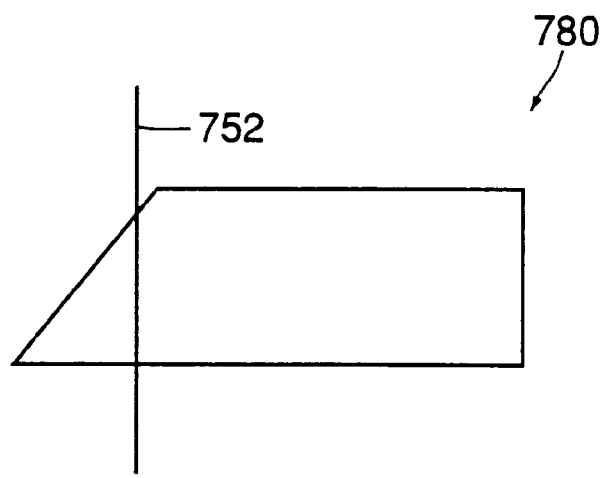
FIGS. 55 and 56 are diagrams for use in illustration of an example of how a minute figure to draw is generated when an inclined side of a trapezoid is over a boundary of a figure processing region according to a conventional technique.
Figure 56:
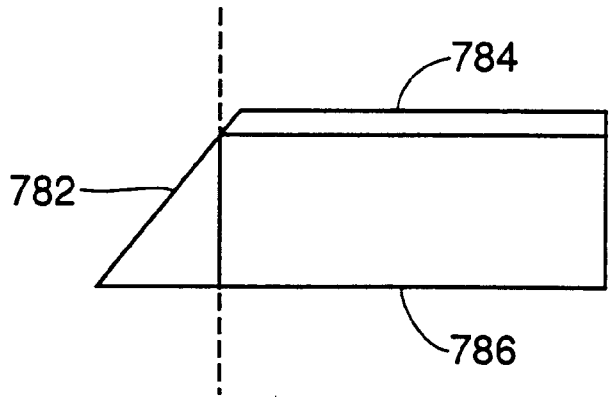

Now a description follows in conjunction with FIG. 86 on how the disadvantage with the conventional method of allocating a trapezoid having a lower base in parallel with the X-axis, which has been described in conjunction with FIGS. 55 and 56 is solved by the apparatus according to this embodiment. As has been described in conjunction with steps 392 and 394 shown in FIG. 78, by the apparatus according to this embodiment, if an inclined side of a trapezoid 470 crosses a boundary 462 of a figure processing region (or drawing field), and the distances from the crossing point to the upper and lower bases are both smaller than minute figure to draw maximum size value $\epsilon$, trapezoid 470 is divided by a vertical line through a vertex closest to figure processing region (or drawing field) boundary 462 in the inclined side. In the example shown in FIG. 86, trapezoid 470 is divided into triangle 472 on the left side and rectangle 474 on the right side by vertical line 475 through vertex 473. Triangle 472 is allocated to the left side figure processing region (drawing field) and rectangle 474 to the right side figure processing region (drawing field). No minute figure to draw as shown in FIG. 56 will be generated. By the apparatus according to this embodiment, the final drawing pattern size precision can be improved as a result.

As in the foregoing, according to this embodiment, faults associated with incorporating figures across boundaries as have been encountered in the conventional cases are not caused, and the generation of minute figures to draw over figure processing region boundaries and drawing field boundaries is reduced, which improves the drawing pattern precision.

Meanwhile, in the apparatus according to this embodiment, whether the degree of reduction of the remaining length of minute figures to draw is saturated is determined in step 370 in order to exit the loop of steps 358 to 368. More specifically, if the length of minute figures to draw is smaller than a prescribed value, or the length of remaining minute figures to draw has scarcely changed as compared to the previous processing result, the saturation of the degree of reduction of the length of minute figures to draw is determined, but the determining method is not limited to this. For example, the above loop processing may be performed a fixed number of times as is in step 178 in FIG. 60. The flow chart shown in FIG. 76 could be readily changed by a person skilled in the art for the above-described purpose. In fact, the inventor has verified through experiments that performing the loop processing twice could adequately reduce the length of minute figures to draw and performing the loop processing more than twice would not reduce the length much more. Conversely, the processing in step 178 shown in FIG. 60 may be replaced by step 370 in FIG. 76.

Figure 87:
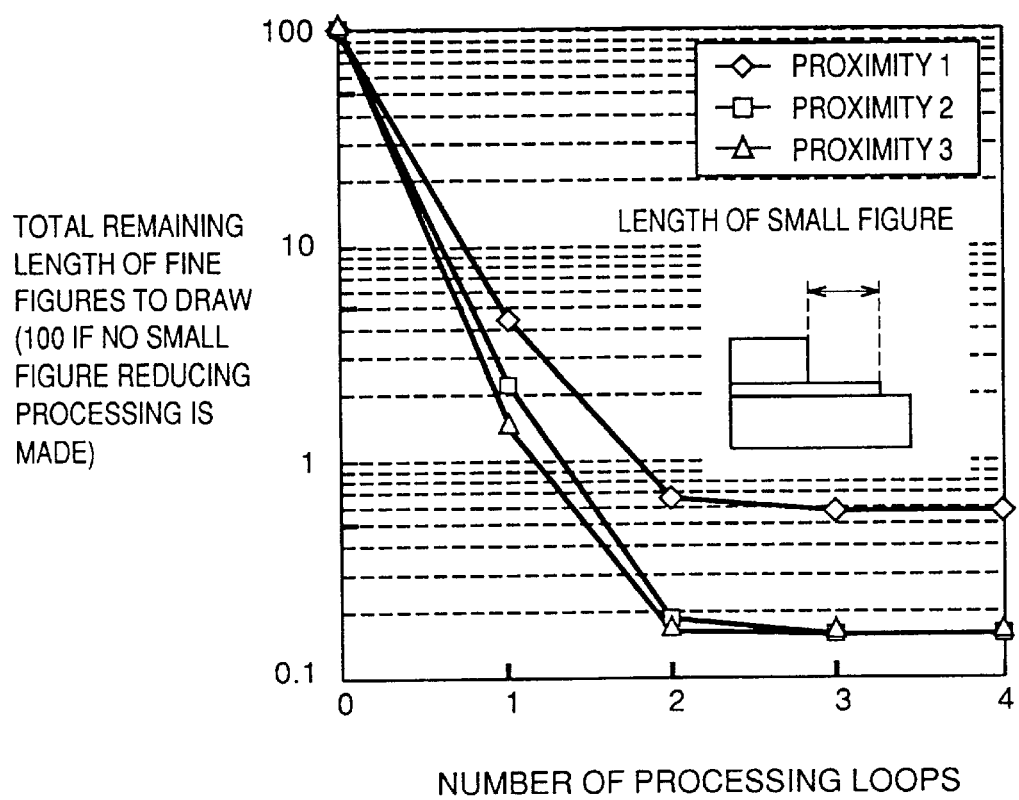
FIG. 87 is a graph showing a result of experiment for verifying the effect of the present invention.

Now, the results of experiments by the inventor are given in FIG. 87. In FIG. 87, the abscissa represents the number of the processing loops, the ordinate the remaining length of minute figures to draw (in total) at the end of each loop. In FIG. 87, the results for the degrees of proximity 1, 2 and 3 during restoring minute figures to draw are given in separate graphs.

Referring to FIG. 87, for any of the degrees of proximity, the remaining length of minute figures to draw was adequately reduced when the number of processing loops is 2, and the result was not much improved by increasing the number of processing loops. Therefore, the number of processing loops may be fixed to 2, and an optimum result could be obtained for a minimum time period.

Referring to FIG. 87, for proximity degree=2, the remaining length of minute figures to draw is considerably reduced as compared to the case for proximity degree=1. Meanwhile, referring to FIG. 87, the result is not much improved for proximity degree=3 or more as compared to proximity degree=2. These results of experiments suggest that if the degree of proximity is fixed as 2, a sufficient effect can be obtained for a minimum processing time period. In addition, if the same degree of proximity is set for minute figure restoring portions 108 and 118, the operation may be simplified.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing charged beam drawing data comprising:

a basic figure processing step of performing a basic figure processing to design layout data to output basic figure data;

a first segmenting step of segmenting said basic figure data as if segmenting a basic figure over a boundary of a figure processing region by said boundary;

a first searching step of searching a minute figure to draw which satisfies a prescribed size condition among figures produced by segmenting in said first segmenting step;

a restoring step of integrating the minute figure to draw searched in said first searching step with a figure adjacent to said minute figure to draw, and performing a further basic figure processing, thereby restoring the figures in said basic figure data;

an allocating step of allocating the figures restored by said restoring step to drawing fields; and a step of converting the figures allocated by said allocating step into charged beam drawing data.

2. The method of producing charged beam drawing data as recited in claim 1, wherein said allocating step includes a second segmenting step of segmenting a basic figure located over a drawing field boundary and occupying at least a prescribed area in drawing fields on both sides of said drawing field boundary by said boundary;

a step of allocating figures produced by segmenting in said second segmenting step and basic figures not over the drawing field boundary to the drawing fields.

3. The method of producing charged beam drawing data as recited in claim 1, wherein said restoring step includes a first proximate figure searching step of searching a proximate figure having a degree of proximity up to n (n: natural number not less than 2) relative to the minute figure to draw searched by said first searching step, and a step of grouping said minute figure to draw searched by said first searching step and said proximate figure searched by said first proximate figure searching step into a grouped figure and dividing the grouped figure into basic figures.

4. The method of producing charged beam drawing data as recited in claim 3, wherein said allocating step includes a determination step of determining whether or not a minute figure to draw is generated when a trapezoid among the figures to be allocated is divided by a crossing point of an inclined side of said trapezoid and the boundary of the figure processing region, and figures produced by the dividing are subjected to a basic figure processing; and a dividing step of dividing said trapezoid by a line segment parallel to said figure processing region boundary and through a vertex closer to said figure processing region boundary among two vertexes on both ends of said inclined side when said determination step determines that a minute figure to draw is generated.

5. The method of producing charged beam drawing data as recited in claim 3, further comprising:

a second searching step of searching a minute figure to draw which is included in said basic figure data output by said basic figure processing step and satisfies a prescribed size condition, a second proximate figure searching step of searching a proximate figure having a degree of proximity up to m natural number not less than 2) relative to the minute figure to draw searched by said second searching step; and a step of grouping said minute figure to draw searched by said second searching step and said proximate figure searched by said second proximate figure searching step into a grouped figure and dividing the grouped figure into basic figures.

6. The method of producing charged beam drawing data as recited in claim 5, wherein said second searching step includes a step of searching only a minute figure to draw which affects a size precision among the figures produced by segmenting in said second segmenting step.

7. The method of producing charged beam drawing data as recited in claim 5, wherein said n=m.

8. The method of producing charged beam drawing data as recited in claim 5, wherein said m=2.

9. The method of producing charged beam drawing data as recited in claim 3, wherein said n=2.

10. The method of producing charged beam drawing data as recited in claim 1, further comprising:

a second searching step of searching a minute figure to draw which is included in said basic figure data output by said basic figure processing step and satisfies a prescribed condition;

a proximate figure searching step of searching a proximate figure having a degree of proximity up to m (m: natural number not less than 2) relative to the minute figure searched by said second searching step; and a step of grouping said minute figure to draw searched by said second searching step and said proximate figure searched by said proximate figure searching step into a grouped figure and dividing the grouped figure into basic figures.

11. The method of producing charged beam drawing data as recited in claim 10, wherein said second searching step includes a step of searching only a minute figure to draw which affects a size precision among the figures produced by segmenting in said second segmenting step.

12. The method of producing charged beam drawing data as recited in claim 10, wherein said n=m.

13. The method of producing charged beam drawing data as recited in claim 10, wherein said m=2.

14. The method of producing charged beam drawing data as recited in claim 1, wherein said first searching step includes a step of searching only a minute figure which affects a size precision among the figures produced by segmenting by said first segmenting step.

15. The method of producing charged beam drawing data as recited in claim 1, further comprising a step of repeating said restoring step until the degree of reduction of the length of remaining minute figures to draw is saturated.

16. The method of producing charged beam drawing data as recited in claim 1, further comprising a step of performing said restoring step again.

17. A mechanically readable recording medium storing a program for making a computer implement a method of producing charged beam drawing data, said method comprising:

a basic figure processing step of performing a basic figure processing to design layout data and outputting basic figure data;

a first segmenting step of segmenting a basic figure over a boundary of a figure processing region in said basic figure data by the boundary;

a first searching step of searching a minute figure to draw which satisfies a prescribed size condition among figures produced by segmenting in said first segmenting step;

a restoring step of integrating the minute figure to draw searched by said first searching step with a figure adjacent to said minute figure to draw and performing a further basic figure processing to restore the figures in said basic figure data;

an allocating step of allocating the figures restored by said restoring step to drawing fields; and converting the figures allocated by said allocating step to charged beam drawing data.

18. The recording medium as recited in claim 17, wherein said allocating step includes a second segmenting step of segmenting a basic figure over a boundary of a drawing field and occupying at least a prescribed area in drawing fields on both sides of said drawing field boundary by said boundary; and a step of allocating figures produced by segmenting in said second segmenting step and basic figures not over the drawing field boundary to the drawing fields.

19. The recording medium as recited in claim 17, wherein said restoring step includes a first proximate figure searching step of searching a proximate figure having a degree of proximity up to n (n: natural number not less than 2) relative to the minute figure to draw searched by said first searching step; and a step of grouping said minute figure to draw searched by said first searching step and said proximate figure searched by said first proximate figure searching step into a grouped figure and dividing the grouped figure into basic figures.

20. The recording medium as recited in claim 19, wherein said n=2.

21. A method of producing charged beam drawing data comprising:

performing basic figure processing on design layout data and outputting basic figure data;

segmenting said basic figure data into figures;

searching said figures to find a minute figure;

integrating said minute figure with a figure adjacent to said minute figure, thereby producing a restored figure;

performing basic figure processing on the restored figures and outputting basic figure data;

segmenting said basic figure data located over a drawing field boundary and occupying at least a prescribed area in drawing fields on both sides of said drawing field boundary by said boundary;

allocating figures produced by said segmenting said basic figure and basic figures not over the drawing field boundary to the drawing fields; and converting the figures allocated by said allocating step into charged beam drawing data.

22. A mechanically readable recording medium storing a program for making a computer implement a method of producing charged beam drawing data, said method comprising:

performing basic figure processing on design layout data and outputting basic figure data;

segmenting said basic figure data into figures;

searching said figures to find a minute figure;

integrating said minute figure with a figure adjacent to said minute figure, thereby producing a restored figure;

performing basic figure processing on the restored figures and outputting basic figure data;

segmenting said basic figure data located over a drawing field boundary and occupying at least a prescribed area in drawing fields on both sides of said drawing field boundary by said boundary;

allocating figures produced by said segmenting said basic figure and basic figures not over the drawing field boundary to the drawing fields; and converting the figures allocated by said allocating step into charged beam drawing data.

* * * * *